United States Patent [19]
Satou et al.

[11] Patent Number: 5,564,183
[45] Date of Patent: Oct. 15, 1996

[54] PRODUCING SYSTEM OF PRINTED CIRCUIT BOARD AND METHOD THEREFOR

[75] Inventors: Kenichi Satou, Ikoma; Makoto Kawai, Neyagawa; Yoshifumi Nakao, Nara; Satoshi Masuda; Koichi Kanematsu, both of Hirakata; Setsuo Horimoto, Katano, all of Japan

[73] Assignee: Matsushita Electric Industrial Co., Ltd., Osaka-fu, Japan

[21] Appl. No.: 129,604

[22] Filed: Sep. 30, 1993

[30] Foreign Application Priority Data

Sep. 30, 1992 [JP] Japan ................................. 4-260449
Sep. 30, 1992 [JP] Japan ................................. 4-260450

[51] Int. Cl.⁶ .......................... H05K 3/34; G06F 19/00
[52] U.S. Cl. ............................ 29/840; 29/593; 29/714; 29/740
[58] Field of Search .......................... 29/593, 709, 714, 29/840, 740; 364/551.01, 552, 554, 468

[56] References Cited

U.S. PATENT DOCUMENTS

| | | | |
|---|---|---|---|
| 4,454,585 | 6/1984 | Ele | 364/552 |
| 4,667,403 | 5/1987 | Edinger et al. | 29/840 |
| 5,086,397 | 2/1992 | Schuster et al. | 364/468 |
| 5,262,954 | 11/1993 | Fujino et al. | 364/468 |

Primary Examiner—P. W. Echols
Attorney, Agent, or Firm—Wenderoth, Lind & Ponack

[57] ABSTRACT

An assembly line includes a printing device for printing solder on a land of a circuit board, a mounting device for mounting an electric component at a predetermined position of the solder, and a soldering device for soldering the land to a terminal of the component. A monitored items detecting device detects predetermined to be monitored items of the board and equipment used in the printing, mounting, or soldering devices, and a control device analyzes a condition of the equipment and quality of the board with reference to warning criterion which do not exceed failure criterion, and then dynamically controls the various devices accordingly.

14 Claims, 29 Drawing Sheets

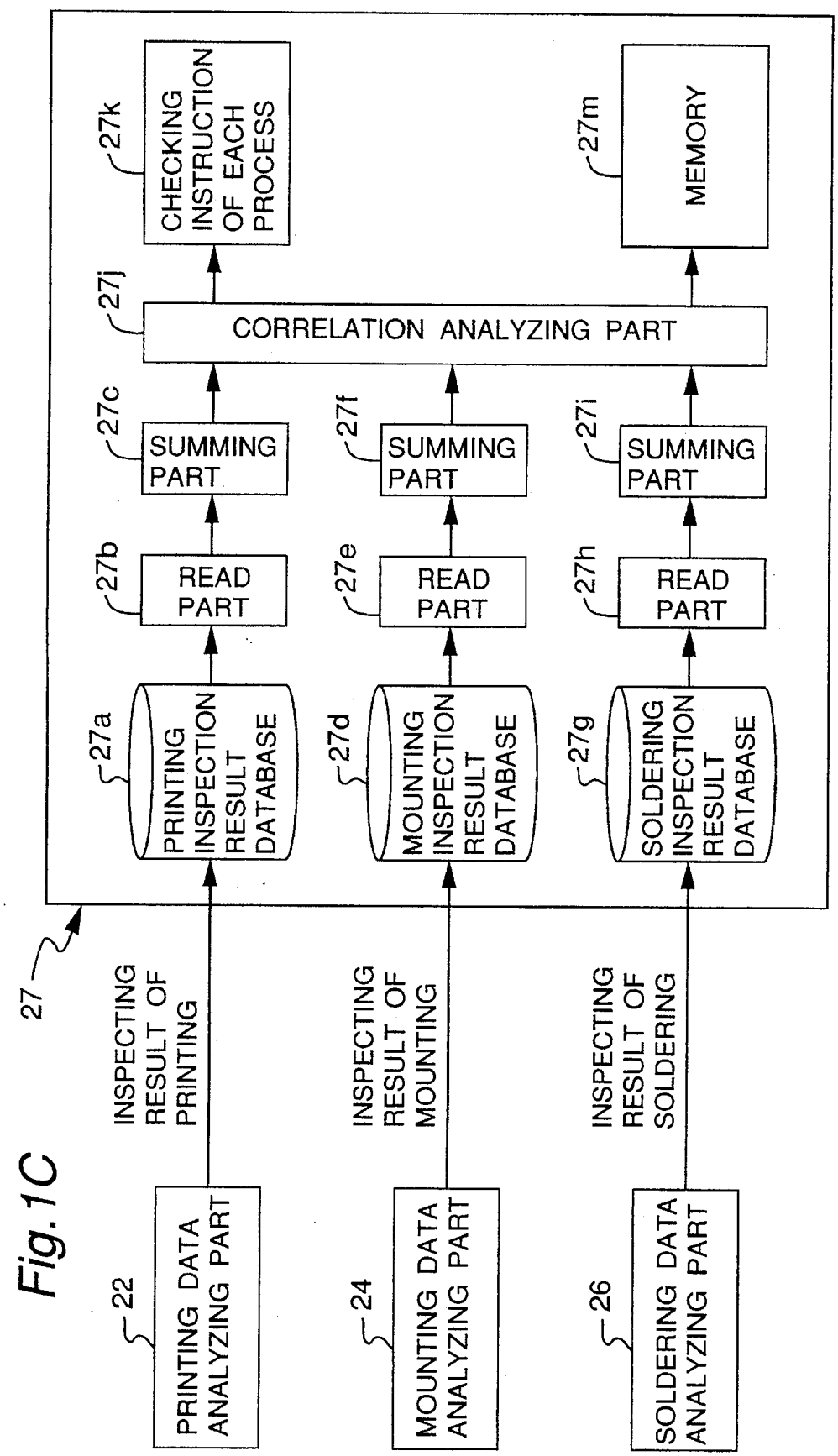

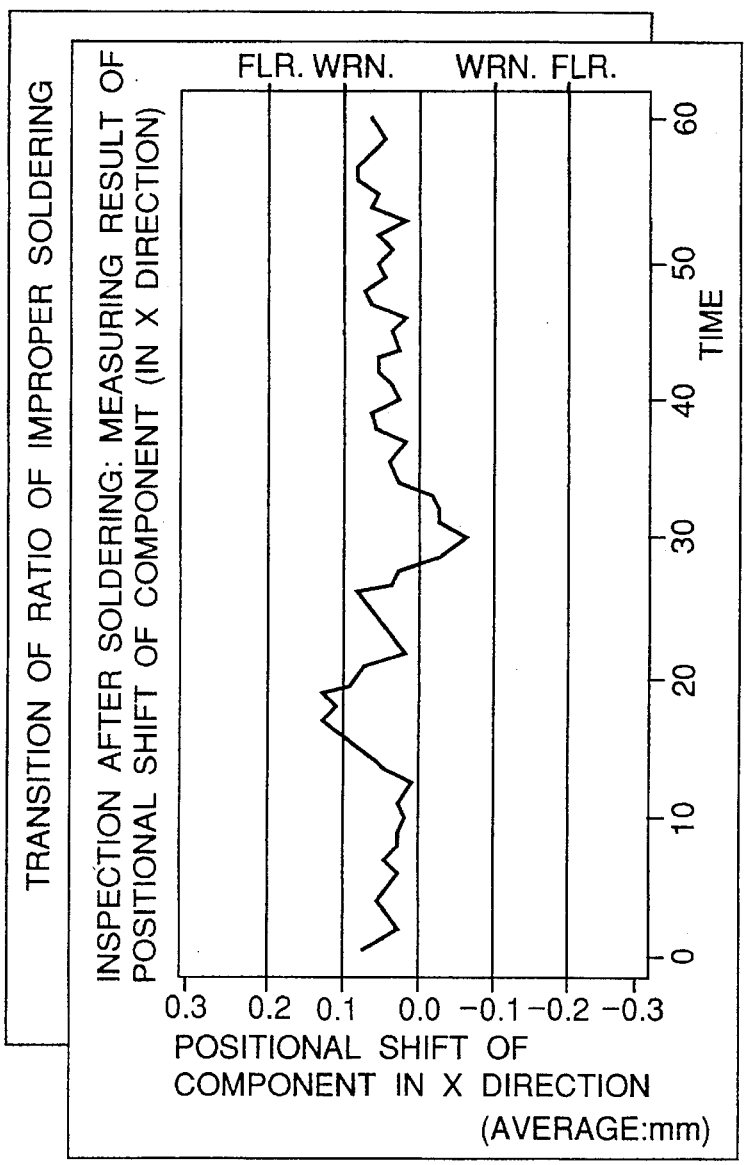
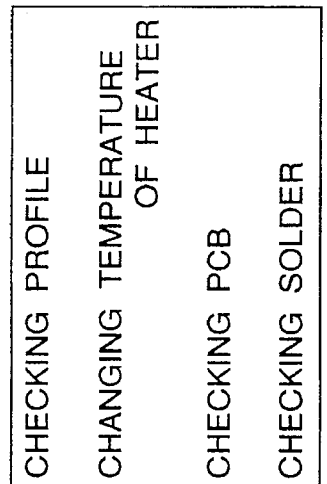
Fig.8

Fig.14

| BAR CODE | CIRCUIT NUMBER | ANALYSIS OF CORRELATION OF PROCESSES BASED ON INSPECTION RESULT | | | |
|---|---|---|---|---|---|
| | | PRINTING INSPECTION | MOUNTING INSPECTION | SOLDERING INSPECTION | — — |
| ×××× | ×× | BLUR(SECOND) | OK | BRIDGE(FIRST) | |
| | ×× | OK | SHIFT(SECOND) | SHIFT(FIRST) | |
| | ×× | BLUR(SECOND) | SHIFT(SECOND) | MANHATTAN PHENOMENON(FIRST) | |
| ×××× | ×× | · | · | · | |
| | ×× | ··· | ··· | ··· | |
| | | ··· | ··· | ··· | |

PRODUCING SYSTEM OF PRINTED CIRCUIT BOARD AND METHOD THEREFOR

BACKGROUND OF THE INVENTION

The present invention relates to a system and a method for producing circuit boards on which electronic components are mounted after having solder printed thereon.

FIG. 22 is a structural block diagram of a conventional system 216 for producing electronic component-mounted circuit boards. The system of FIG. 22 includes a solder printing section 203, an electronic component mounting section 204, and a soldering section 205. These sections are arranged sequentially down stream along a circuit board transfer line. A cream solder printing device 210 of the solder printing section 203 prints cream solder on lands of objects to be printed such as circuit boards or the like. A cream solder printing inspecting device 211 inspects the states of the circuit boards and the printing facilities, and also the printing state of the cream solder printed by the printing device 210. A data processor 220, which is connected to the inspecting device 211 and the printing device 210, analyzes the data outputted from the inspecting device 211 for feedback control of the printing device 210.

In the electronic component mounting section 204, a mounting device 212 transfers suction nozzle heads to an electronic component feeding section using an X-Y driving device, then suctions the electronic components using the suction nozzle heads, and feeds the electronic components to mounting positions where they are to be mounted on the circuit boards. The mounting device 212 mounts the electronic components so that the leads and the electrodes are positioned on the printed cream solder located on the lands. At this time, the suction state of the electronic components is viewed by an electronic component recognizing camera to evaluate the suction error. A post-mounting inspecting device 213 inspects the electronic components mounted at predetermined positions on the circuit boards and also the operating state of the facilities. A data processor 221, which is connected to the post-mounting inspecting device 213 and to the mounting device 212, analyzes the data from the post-mounting inspecting device 213, to thereby effect feedback control of the mounting device 212.

Further, in the soldering section 205, a conveyor is arranged in a reflow furnace 214 to transfer the circuit boards to be heated in the furnace. Heaters are placed above and below the conveyor, having upper and lower fans. Hot wind of heated gas is blown onto the circuit boards by the fans. The interior of the reflow furnace 214 is sectioned into a preheating chamber, a reflow heating chamber, and a gradual-cooling chamber. The above heaters and fans are provided in each chamber. The electronic components are soldered to the circuit boards by the reflow of the cream solder when the circuit boards are uniformly heated in the reflow heating chamber. A soldering inspecting device 215 inspects the soldering state of the electronic components on the circuit boards and the operating state of the facilities. A data processor 222, which is connected to the soldering inspecting device 215 and to the reflow furnace 214 analyzes the data of the inspecting device 215 to thereby affect feed-back control of the reflow furnace 214.

The operation of the producing system 216 will now be described. In the first place, cream solder is printed by the cream solder printing device 210 on the land of a circuit board. The state of the circuit board and the facilities, and the printing state of the cream solder on the land (for example, whether the cream solder is blurred or thinned or shifted, or the presence/absence of printing of the cream solder, etc.) are inspected by the inspecting device 211. The output data from the inspecting device 211 is analyzed by the data processor 220, whereby the printing device 210 is controlled to restrict the generation of defective products.

Subsequently, the mounting device 212 transfers the suction nozzle head to the electronic component feeding section using an X-Y driving device to suction and move the electronic component to the mounting position of the circuit board. The electronic component is applied to a predetermined position of the circuit board and mounted by utilization of the viscosity of the cream solder on the land. The state or condition of the mounting device 212, and the mounting state of the electronic component (e.g., an absence of the electronic component, an improper orientation of the component, a shift of the mounting position, an erroneous mounting in polarity, or the like) are inspected by the post-mounting inspecting device 213. The data outputted from the inspecting device 213 is analyzed in the data processor 221, to thereby control the mounting device 212 to prevent the generation of defective products.

The circuit boards are transferred into the reflow furnace 214 by the conveyer. When the hot gas is blown onto the circuit board by the fans, the circuit board is preliminarily heated and the printed cream solder on the land is reflowed in the reflow heating chamber and then gradually cooled. As a result, the leads or the electrodes of the electronic component are soldered to the land of the circuit board. The inspecting device 215 inspects the state of the reflow furnace 214 and the soldering state of the electronic component on the circuit board (e.g., an absence of the electronic component, an improper orientation of the component, a shift of the mounting position, an erroneous mounting in polarity, or the like). The data of the inspecting device 215 is fed back after being analyzed by the data processor 222 to control the reflow furnace 214 to restrict the generation of defective products.

Conventionally, in the case where the circuit board is detected as being defective in the solder printing section 203, the electronic component mounting section 204, or the soldering section 205, the circuit board is discharged or corrected.

In the prior art technique as above, the data from the inspecting devices 211, 213, and 215 are analyzed by the corresponding processors 220, 221, and 222 and fed back to avoid the generation of defective products. However, when the electronic components are mounted at a high density on the circuit board, the causes of circuit board defects is complex and related to numerous processes and items to be monitored. Therefore, it is not sufficient simply to carry out feed-back control for each section individually.

Referring again to FIG. 22, the printed circuit board manufacturing section 201 and the screen manufacturing section 202 are arranged at the upstream of the transfer line relative to the solder printing section 203. In the printed circuit board manufacturing section 201, a printed circuit board manufacturing device 206 forms a circuit pattern having a land pattern on the board. A printed circuit board inspecting device 207 inspects the position and the shape of the land of the printed circuit board and the state of the circuit pattern, etc. In the screen manufacturing section 202, on the other hand, a screen generator 208 forms a screen to be used in printing of the cream solder in the solder printing section 203. A screen inspecting device 209 inspects the position and the shape of the pattern of the screen and the state of the circuit pattern, etc.

Conventionally, the inspecting data used as reference data, such as target values, allowable ranges, inspecting conditions or the like to operate each inspecting device 207, 209, 211, 213, and 215, are formed through learning of the X-Y coordinates, the mask data, and the land data of the actual printed circuit board. Although CAD data may sometimes be partly employed as mounting data, only the restricted data such as X-Y coordinates or the like are used, with an aim of efficiently forming the data by reducing the number of inputs by the operator.

FIGS. 23A and 23B illustrate the manner in which the inspecting data is formed in the prior art. As shown in FIG. 23A, in forming the inspecting data, conventionally, command codes of each electronic component to be inspected are sequentially determined and inputted manually with reference to the basic data related to each land to be printed (namely, the name, position, and posture of the land), the basic data related to an electronic component corresponding to the to-be-inspected land (i.e., name, position, and posture of the electronic component), and a command code table formed from a table which is formed based on a machine data corresponding to each data after the allowable values at the time of inspection based on the above basic data are selected.

In another technique, as indicated in FIG. 23B, the circuit board which has already been detected as having correctly printed cream solder or soldered cream solder is read by a printing inspecting device or the like, and the necessary data is loaded into the inspecting device, and inspecting conditions such as the permissible values or the like are additionally inputted manually.

In the above-described arrangement, the actual inspecting data used as a reference including target values, permissible ranges, and inspecting conditions, etc. are not estimated before the circuit board is inspected and the inspecting result each time is accumulated and statistically processed. Vagueness and uncertainty exists as to whether the inspecting data formed on the basis of the irregular data of circuit boards is accurate. It is also difficult to correctly and quickly identify the nature of problems in the production line, i.e., whether the printed circuit board under inspection itself is defective or the inspecting data is improper, that is, it is difficult to promptly decide the presence/absence of a defect and the cause of the defect.

More specifically, although the ideal shape, area, and amount of the solder or the solder fillet can be assumed in the stage of design, it is not easily realized on the actual printed circuit board. As shown in FIG. 24, even in the case where the displacement (A) of the printing position between a land 217 and a printed cream solder 218 on the printed circuit board, and the displacement (B) of the mounting position between the printed cream solder 218 and an electronic component 219 on the printed circuit board is detected, it is not clear which of the land 217 and the cream solder 218 is shifted, whether the electronic component 219 or the cream solder 218 is shifted, and further whether an alignment mark is shifted. Moreover, with respect to the soldering position, it is considerably difficult to determine whether the electronic component 219 is shifted or the solder fillet is shifted, or whether the alignment mark is shifted. In this case, the operator is obliged to make a decision from his or her experience, but without guarantee that his or her decision is correct. The decision may lead to an erroneous feed-back or delay due to an unnecessary correction in the worst case.

Further, as the printed circuit board becomes more and more densely fitted, the accuracy required in each of the printed circuit board producing process, the screen producing process, the cream solder printing process, the component mounting process, and the soldering process is strict and even a slight error is not allowed. It is not possible for the conventional arrangement to meet such requirements.

SUMMARY OF THE INVENTION

The object of the present invention is therefore to provide an improved system for producing a circuit board on which electronic components are mounted.

A further object of the present invention is to provide a criterion data processing system designed to secure the processing accuracy previous assembly stages including the designing stage of the printed circuit boards, whereby each process is checked on the basis of common criterion of the production line to thereby detect correctly and quickly the presence/absence and cause of defects for each process, thus securing high product quality with the use of the accumulated checking data.

In accomplishing these and other objects, according to a first aspect of the present invention, there is provided a system for producing a circuit board on which an electronic component is mounted and which is provided with a printing device for printing solder on a land of the circuit board, an electronic component mounting device for mounting the electronic component at a predetermined position of the printed solder, and a soldering device for soldering the land of the circuit board to a terminal of the electronic component, the system further includes a monitoring items detecting device for detecting predetermined to be monitored items of the circuit board and equipment contained in at least one of the printing device, electronic component mounting device, and soldering device, and a control device for analyzing a condition of the equipment and a quality of the circuit board with reference to warning criterion not exceeding failure criterion. A monitor is also included for outputting analyzing result of the control means at a monitor.

According to a second aspect of the present invention, there is provided a method of producing a circuit board on which an electronic component is mounted. The method includes printing solder on a land of the circuit board, mounting the electronic component at a predetermined position of the printed solder, and soldering the land of the circuit board to a terminal of the electronic component. The method further includes detecting predetermined to be monitored items of assembly line equipment and of the circuit board, and analyzing a condition of the equipment and a quality of the circuit board with reference to warning criterion not exceeding failure criterion. The method also includes outputting an outputting analyzing result to a monitor.

BRIEF DESCRIPTION OF THE DRAWINGS

These and other objects and features of the present invention will become clear from the following description taken in conjunction with the preferred embodiments thereof with reference to the accompanying drawings, in which:

FIG. 8 is a graph of an example of the time-series analyzing result of the shift of the mounting position of soldered electronic components in the soldering data analyzing part of FIG. 1A and a display monitor showing the content of a maintenance instruction as an operation control and a feed-back instruction each consequent to the analysis;

FIG. 14 is a diagram of the correlation of processes;

DETAILED DESCRIPTION OF THE PREFERRED EMBODIMENTS

Figure 1A:
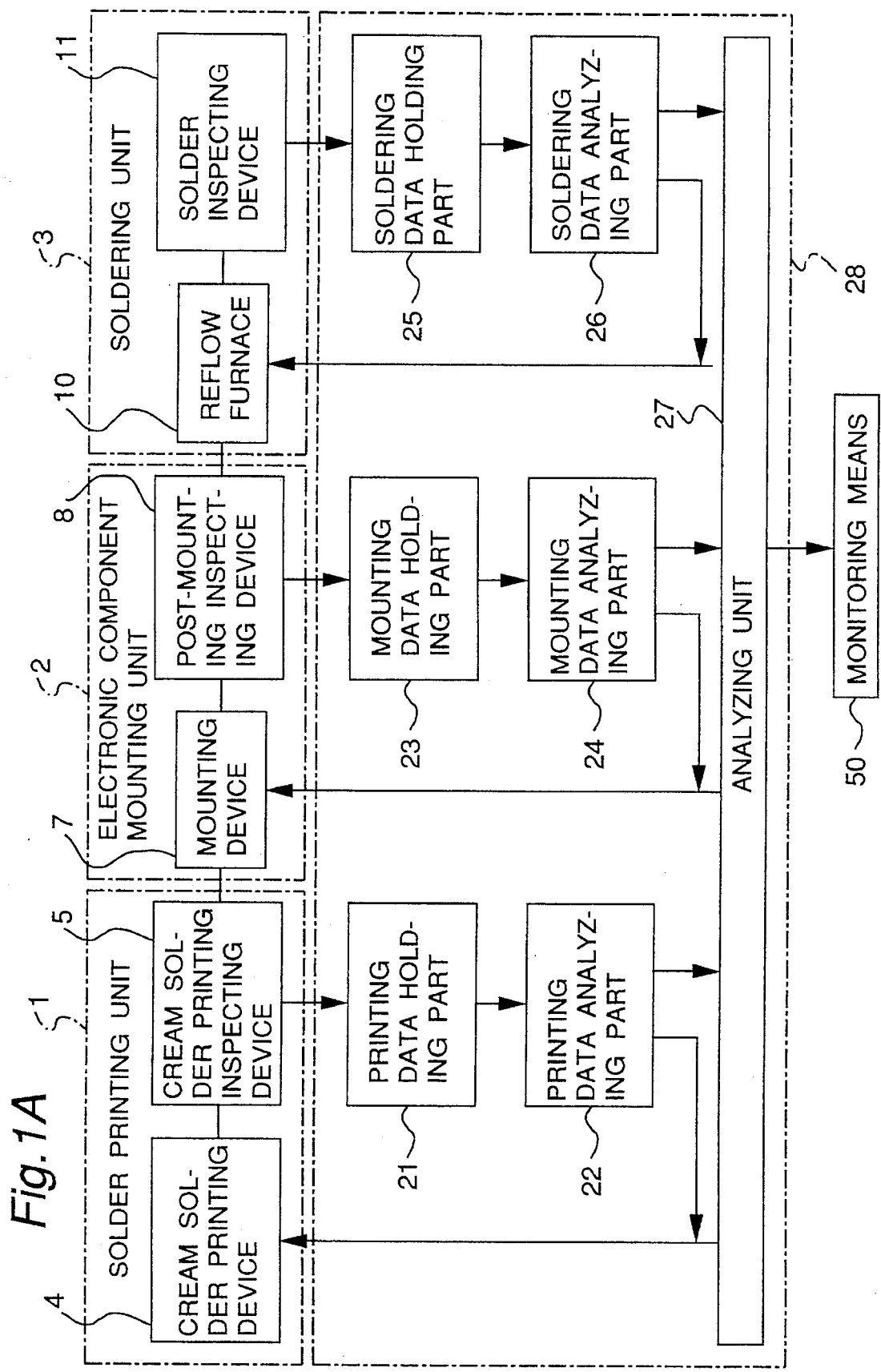
FIGS. 1A and 1B are a structural block diagram and a flow chart of the operation of a system for producing a circuit board on which electronic components are mounted according to a first embodiment of the present invention.

Before the description of the present invention proceeds, it is to be noted that like parts are designated by like reference numerals throughout the accompanying drawings.

A first embodiment of the present invention will be discussed hereinbelow with reference to the accompanying drawings.

Figure 1B:
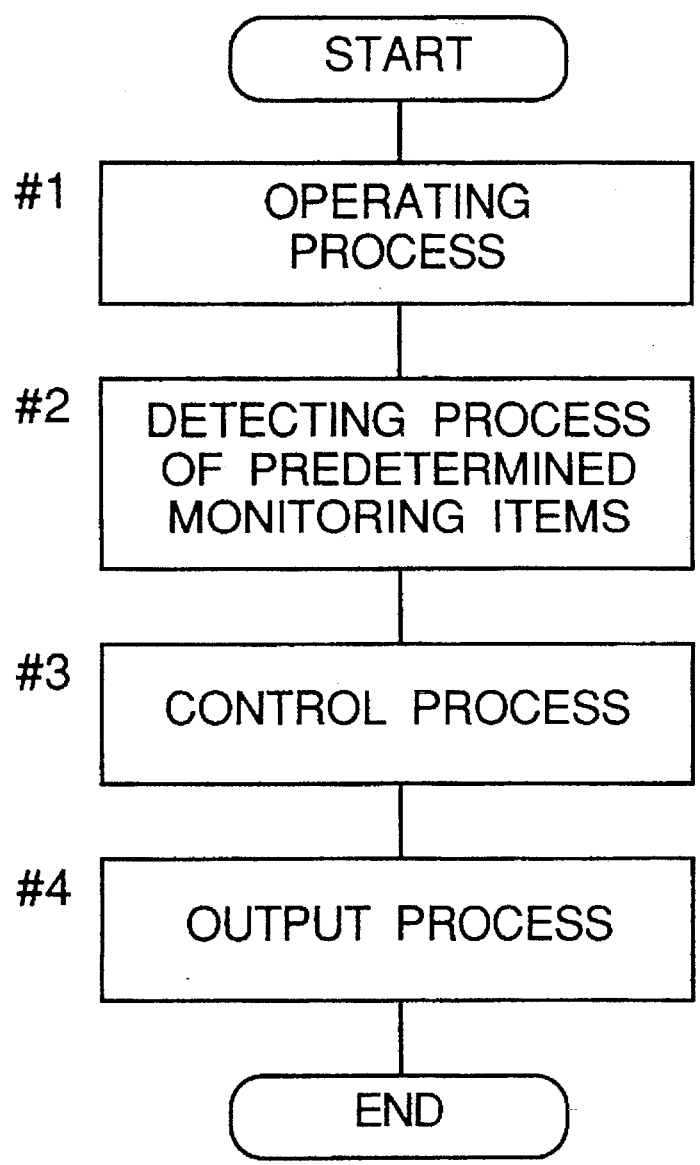

FIG. 1A is a block diagram showing the constitution of a system for producing circuit boards on which electronic components are mounted according to a first embodiment of the present invention. FIG. 1B is a flow chart showing an operating process, a detecting process, a control process, and an output process carried out in one or more of a solder printing process, an electric component mounting process, and a soldering process.

In a solder printing unit 1 of the system, a cream solder is printed on a circuit board by a cream solder printing device 4 in the solder printing process at step #1 indicated in FIG. 1B. The printing state is inspected by a cream solder printing inspecting device 5 in the detecting process at step #2. In the electronic component mounting process at step #1 of FIG. 1B, then, an electronic component is mounted to the circuit board by a mounting device 7 in an electronic component mounting unit 2 and the mounting state is inspected by a post-mounting inspecting device 8 in the detecting process at step #2. The circuit board with the electronic component is put in a reflow furnace 10 in a soldering unit 3 in the soldering process at step #1 of FIG. 1B, whereby the cream solder and the electronic component are soldered on the circuit board. The soldering state is inspected by a solder inspecting device 11 in the detecting process at step #2. As shown in FIG. 1B, the detecting process (step #2) of predetermined items to be monitored, and the control process (step #3) based on the detecting result at step #2 are carried out before the output process (step #4). These processes at steps #2–#4 will be described later.

In FIG. 1A, a printing data holding part 21 connected with the cream solder printing inspecting device 5 collects and holds the data of monitored items of the printing state of the cream solder printed on the land, (e.g., printing blur, printing shift, presence/absence of the printed solder, etc.), and also collects and retains the data of monitored items related to the circuit board and printing facilities (such as the shift amount of a mark of the circuit board and shift amount of a mark of the screen, and the like). The printing data holding part 21 is connected to a printing data analyzing part 22 which analyzes the data collected by the printing data holding part 21 according to every monitored item, circuit number, facility, etc. in summation fashion, or a time-series fashion, or a like manner, to thereby determine the operating state of the cream solder printing device 4 and the quality of the circuit board passing through the cream solder printing device 4 on the basis of the comparison of the analyzing result with preset warning criteria not exceeding failure decision criteria of the predetermined data. The printing data analyzing part 22 is connected to the cream solder printing device 4, and outputs an operation control instruction to the cream solder printing device 4 in accordance with the state of the cream solder printing device 4 and the quality of the circuit board passing through the cream solder printing device 4. In consequence, the operating state of the cream solder printing device 4 is correspondingly and dynamically changed to produce good products.

A mounting data holding part 23 connected to the post-mounting inspecting device 8 collects and holds the monitoring data of the mounting state of the electronic component mounted by the mounting device 7 (for example, absence of the electronic component, improper orientation of the electronic component shift of the mounting position, erroneous mounting in polarity and the like), as well as the data related to the mounting facilities (for instance, the suction error of a suction nozzle, recognition error or the like). A mounting data analyzing part 24 connected to the mounting data holding part 23 analyzes the collected data of the mounting data holding part 23 for each monitoring item, circuit number, equipment, etc. in an accumulative manner, or in a time-series or like manner, to thereby detect the state of the mounting device 7 and the quality of the circuit board passing through the mounting device 7 on the basis of a comparison with preset warning criteria not exceeding failure decision criteria of the predetermined data. The mounting data analyzing part 24 is connected to the mounting device 7 to correspondingly and dynamically control the operating state of the device 7 through an operation control instruction corresponding to the state of the mounting device 7 and the quality of the circuit board passing through the mounting device 7 to produce good products.

Further, a soldering data holding part 25 is connected to the soldering inspecting device 11. The monitoring data of the soldering state of the electronic component on the circuit board (e.g., absence of the electronic component, improper orientation of the electronic component, shift of the mounting position, or erroneous mounting in polarity) is collected and retained by the soldering data holding part 25. At the same time, the monitoring data of the reflow facilities (e.g., the temperature of a heater, the speed of a conveyor, and the concentration of oxygen) are also collected and retained by the soldering data holding part 25. A soldering data analyzing part 26 connected to the soldering data holding part 25 analyzes the collected data of the soldering data holding part 25 for each monitoring item, circuit number, facility, etc. in an accumulative fashion, or in a time-series fashion, or the like. As a result, the state of the reflow furnace 10 and the quality of the circuit board passing through the reflow furnace 10 can be detected through comparison of the analyzing result with preset warning criteria not exceeding failure decision criteria of the predetermined data. The soldering data analyzing part 26 connected to the reflow furnace 10 feeds an operation control instruction to the reflow furnace 10 corresponding to the state of the reflow furnace 10 and the quality of the circuit board passing through the reflow furnace 10 to correspondingly and dynamically change the operating state of the reflow furnace 10 to produce good products.

The printing data analyzing part 22, mounting data analyzing part 24, and soldering data analyzing part 26 are all connected to an analyzing unit 27. The analyzing unit 27 is in turn connected to control the cream solder printing device 4, mounting device 7, and reflow furnace 10, by outputting an operation control instruction to at least any one of the cream solder printing device 4, mounting device 7, and reflow furnace 10 after analyzing the correlation of processes related to the cause of the failure of the monitored items based on each analyzing data and analyzing result from the analyzing parts 22, 24, and 26. In the manner, good products are produced by correspondingly and dynamically changing the operation.

A control means 28 is composed of a computer including the above printing data holding part 21, mounting data holding part 23, soldering data holding part 25, printing data analyzing part 22, mounting data analyzing part 24, soldering data analyzing part 26, and analyzing unit 27. The control means 28 controls a monitoring means 50 which is, for instance, an alarming buzzer, a display monitor, or a printer to provide a facilities warning based on the comparison between the monitoring item data and the warning criterion set for each data or the comparison between a combination of the plural monitoring item data and their warning criteria. The accumulative or time-series analyzing data and result for every monitoring item, circuit number, facility, etc. and the correlation analyzing data of the processes are sequentially formed into a database by the control means 28, so that a necessary data can be retrieved and output to the monitor display or printed out at a required time.

The constitution of the analyzing unit 27 is shown in detail in FIG. 1C. The analyzing unit 27 is provided with a printing inspection result database 27a, a read part 27b, a summing part 27c, a monitoring inspection result database 27d, a read part 27e, a summing part 27f, a soldering inspection result database 27g, a read part 27h and a summing part 27i. Specifically, the database 27a reads and stores the inspecting result of the printing process outputted from the printing data analyzing part 22. The data stored in the database 27a is read by the read part 27b at a suitable time, and the read data is collected and summed by the summing part 27c. The mounting data outputted from the analyzing part 24 is read and stored in the database 27d. The stored data in the database 27d is read by the read part 27e at a suitable time, and the read data is collected and summed by the summing part 27f. The soldering result outputted from the soldering data analyzing part 26 is read and stored in the database 27g. The stored data in the database 27g is read out by the read part 27h at a suitable time, and the read data is collected and summed by the summing part 27i. Moreover, the analyzing unit 27 is provided with a correlation analyzing part 27j to which are connected the above three summing parts 27c, 27f, and 27i, a monitor 27k connected to the correlation analyzing part 27j for displaying an instruction based on the checking result of each process, and a memory 27m connected to the correlation analyzing part 27j for registering the analyzing result in the correlation analyzing part 27j as a rule as necessary.

Figure 1D:
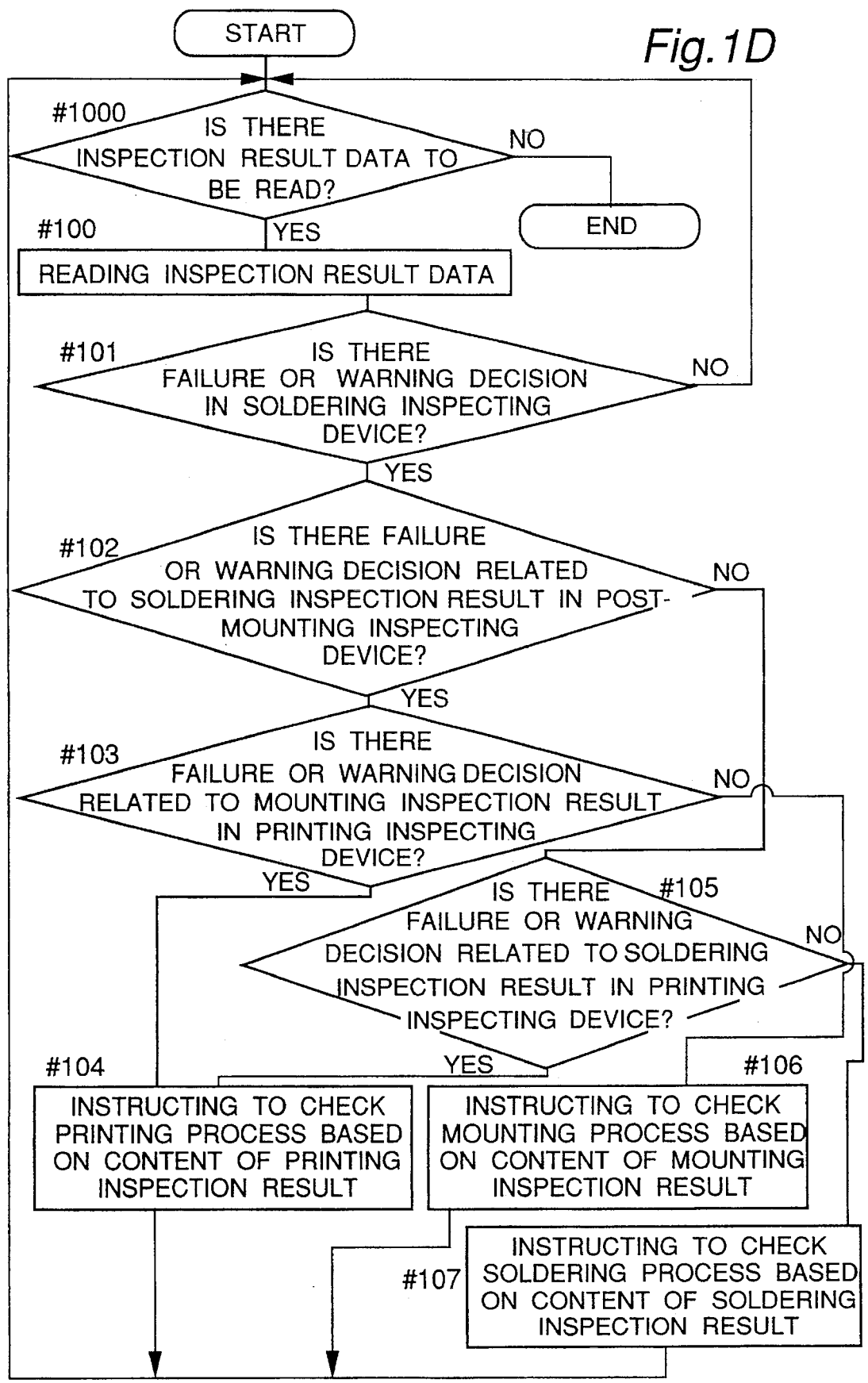
FIG. 1D is a flow chart of a first example of the correlation analyzing algorithm of in the system of FIG. 1A.

The operation of the analyzing unit 27 in the aforementioned structure will now be described. FIG. 1D shows a first example of the algorithm of the analyzing unit 27. It is detected at step #1000 whether an inspecting result data to be read is present. If there is a data to be read, the flow proceeds to step #100. If there is not any data to be read, the flow is terminated. The inspecting result is read by the read parts 27b, 27e, and 27h at step #100, and then it is decided by the correlation analyzing part 27j at step #101 whether or not the solder inspecting device 11 has carried out a failure or warning decision. The flow is returned to step #1000 when the device 11 has not carried out such a decision. When a failure or warning decision is present at step #101, it is detected by the correlation analyzing part 27j at step #102 whether the post-mounting inspecting device 8 generates a failure decision or warning decision related to the inspecting result of soldering. In the presence of the failure decision or warning decision at step #102, it is detected again by the correlation analyzing part 27j at step #103 whether or not the cream solder printing inspecting device 5 makes a failure decision or warning decision related to the inspecting result of mounting. If the failure decision or warning decision is detected at step #103, the flow goes to step #104, where an instruction to check the solder printing process based on the content of the inspecting result of printing is outputted and displayed by the monitor 27k. If the failure decision or warning decision is not detected at step #102, it is detected at step #105 by the correlation analyzing part 27j whether a failure decision or warning decision related to the inspecting result of soldering is output from the cream solder printing inspecting device 5. The flow proceeds to step #104 when the failure decision or warning decision is detected at step #105. If the failure decision or warning decision is not present at step #105, an instruction to check the soldering process on the basis of the content of the inspecting result of soldering is outputted at step #107, and the instruction is displayed by the monitor 27k. When the failure or warning decision is not detected at step #103, an instruction to check the mounting process on the basis of the content of the inspecting result of mounting is outputted at step #106 and displayed by the monitor 27k. After displaying the instruction on the monitor 27k at steps #104, #106, and #107, the flow is returned to step #1000.

Figure 1E:
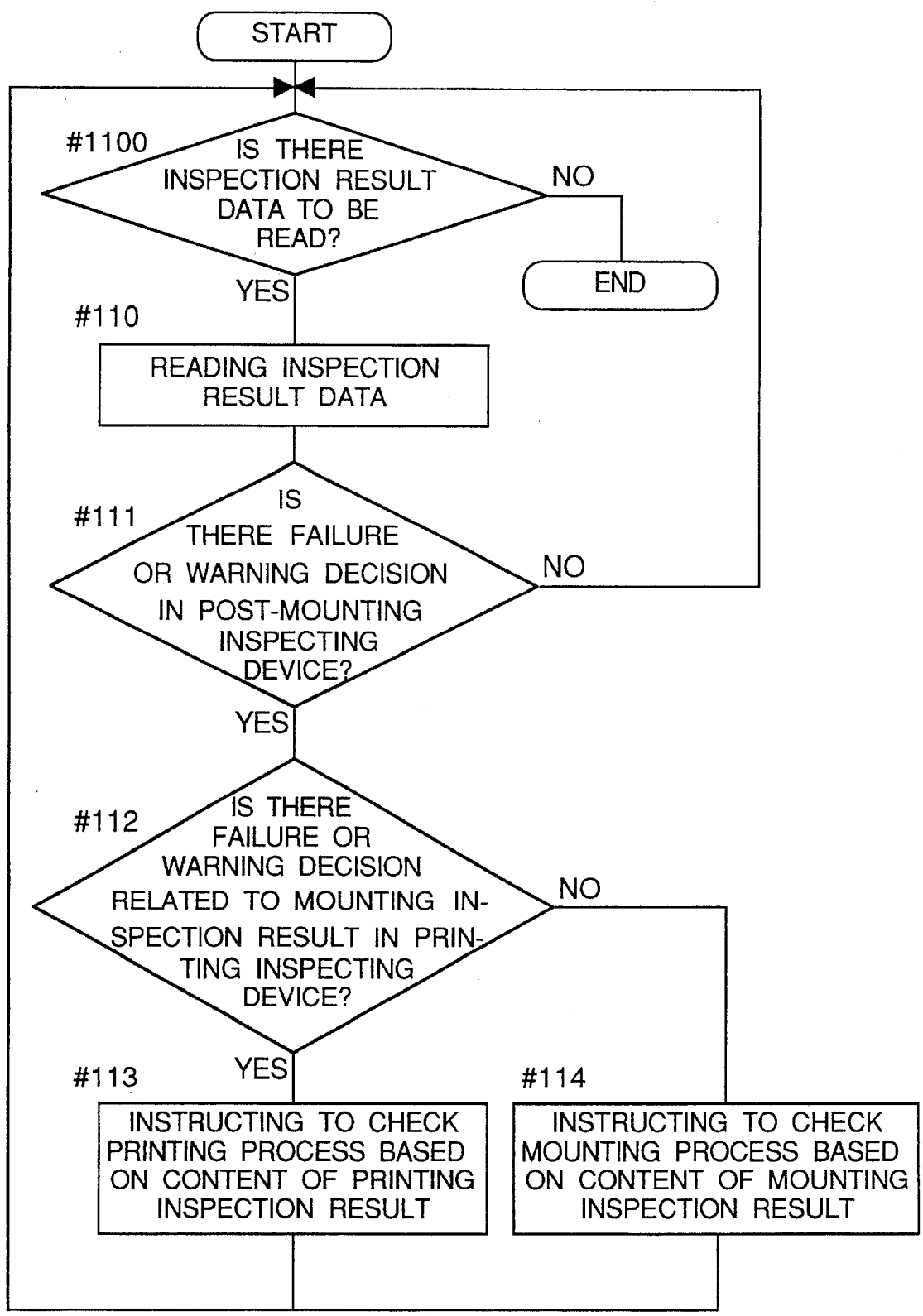
FIG. 1E is a flow chart of a second example of the correlation analyzing algorithm in the system of FIG. 1A.

FIG. 1E is a diagram of a second example of an algorithm of the analyzing unit 27. It is detected whether there is a data of the inspecting result to be read at step #1100. If there is a data, the flow proceeds to step #110. On the other hand, if no data is present to be read, the flow is terminated. At step #110, the inspecting result data is read by the read parts 27b, 27e, and 27h. It is then detected at step #111 by the correlation analyzing part 27j whether the post-mounting inspecting device 8 generates a failure decision or warning decision. If the failure or warning decision is made at step #110, the correlation analyzing part 27j detects at step #112 whether the printing inspecting device 5 generates a failure decision or warning decision related to the inspecting result of mounting. If the failure decision or warning decision is detected at step #112, the flow goes to step #113, so that an instruction to check the printing process based on the content of the inspecting result of printing is outputted and displayed to the monitor 27k. If the failure decision or warning decision is not detected at step #111, the flow is returned to step #1100. Moreover, if the failure decision or warning decision is not detected at step #112, an instruction to check the mounting process based on the content of the inspecting result of mounting is outputted, and displayed to the monitor 27k at step #114.

Figure 1F:
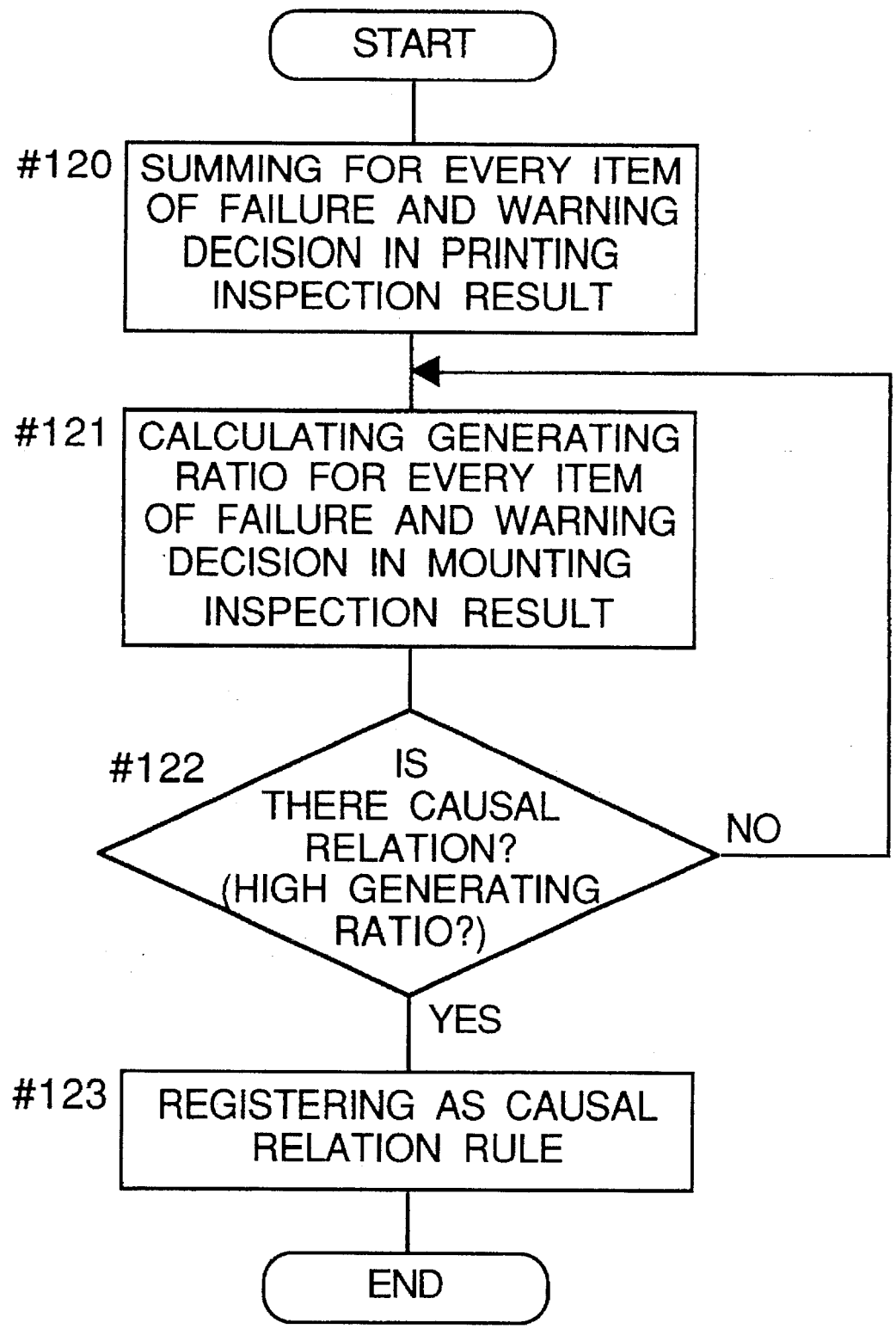
FIG. 1F is a flow chart of a third example of the correlation analyzing algorithm in the system of FIG. 1A.

FIG. 1F is a third example of an algorithm of the analyzing unit 27. At step #120, data is summed in the summing part 27c for every item of the failure decision and the warning decision of the inspecting result of printing. Subsequently, at step #121, the generating ratio for every item of the failure decision and the warning decision in the inspecting result of mounting is calculated in the summing part 27f. It is detected at step #122 by the correlation analyzing part 27j whether or not the generating ratio calculated at step #121 is high, namely, whether or not there is causal relation between the printing process and the mounting process. It is detected that there is the causal relation if the generating ratio is high in both the processes. When the causal relation is detected to be present at step #122, it is stored as a causal relation rule in the memory 27m at step #123, and then the flow is completed. If it is detected at step #122 that there is no causal relation between the two processes, the flow is returned to step #121.

FIG. 1G is a fourth example of an algorithm of the analyzing unit 27. The summing part 27f sums the data for each item of the failure decision and the warning decision in the inspecting result of mounting at step #130. Then, at step #131, the summing part 27i calculates the generating ratio of each item of the failure decision and the warning decision in the inspecting result of soldering. Whether the generating ratio calculated at step #131 is high, i.e., whether causal relation is found is detected at step #132. When the causal relation is detected, it is registered as a causal relation rule in the memory 27m at step #133, to thereby finish the flow. If no causal relation is detected at step #132, the flow is returned back to step #131.

Figure 1:
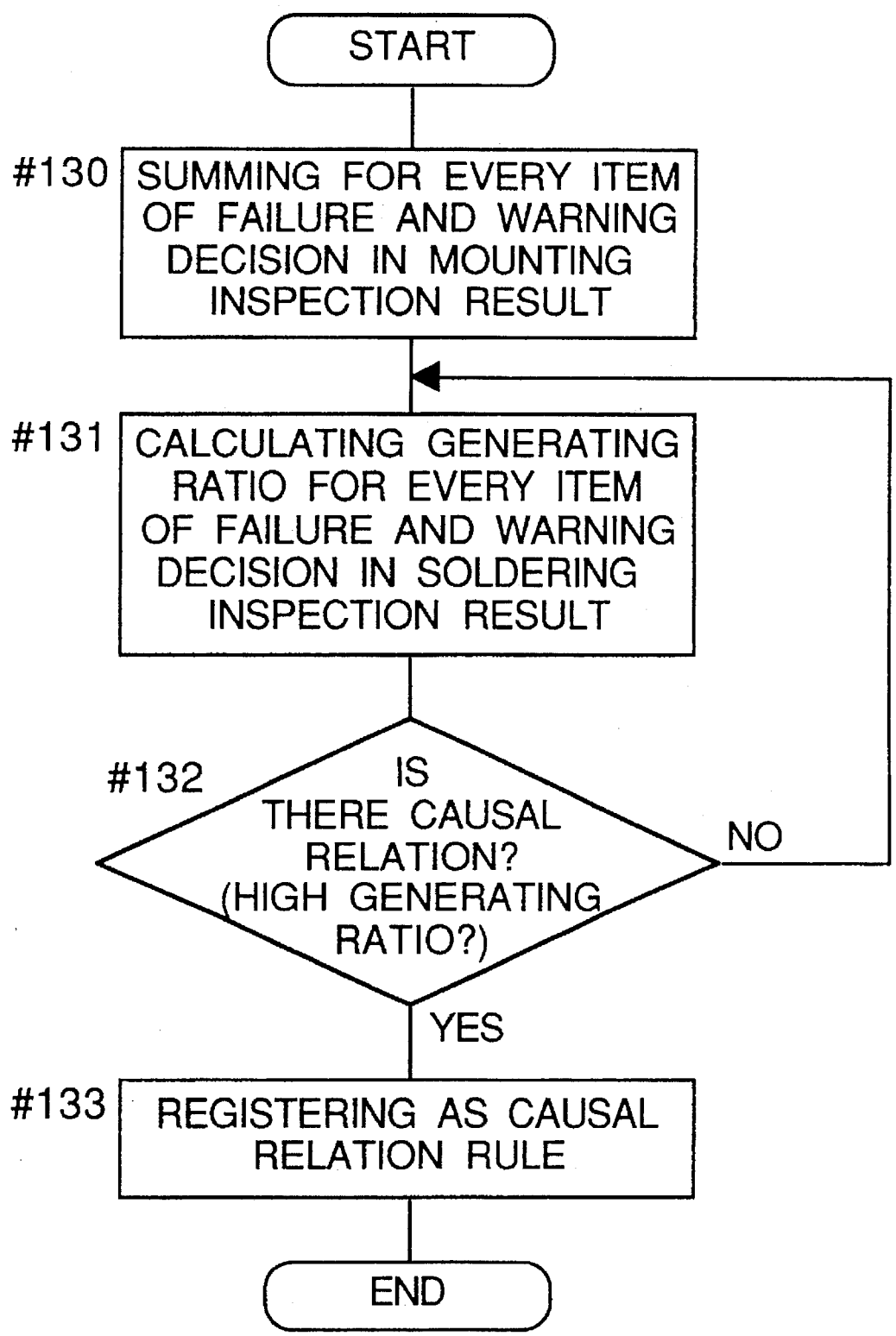
FIG. 1C is a block diagram of an analyzing unit of FIG. 1A.
FIG. 1G is a flow chart of a fourth example of the correlation analyzing algorithm in the system of FIG. 1A.
FIG. 1H is a flow chart of a fifth example of the correlation analyzing algorithm in the system of FIG. 1A.
Figure 1H:
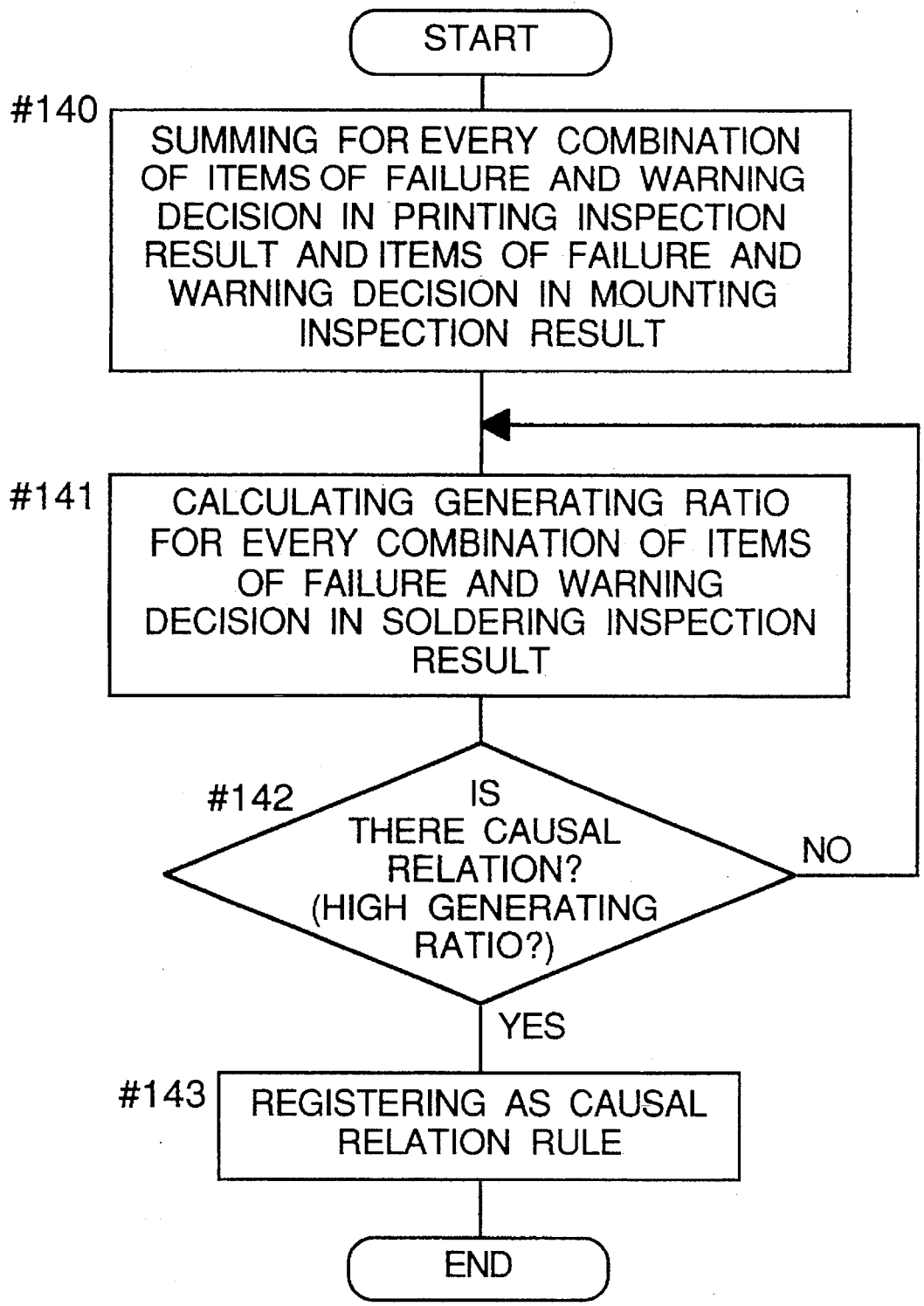
Figure 2:
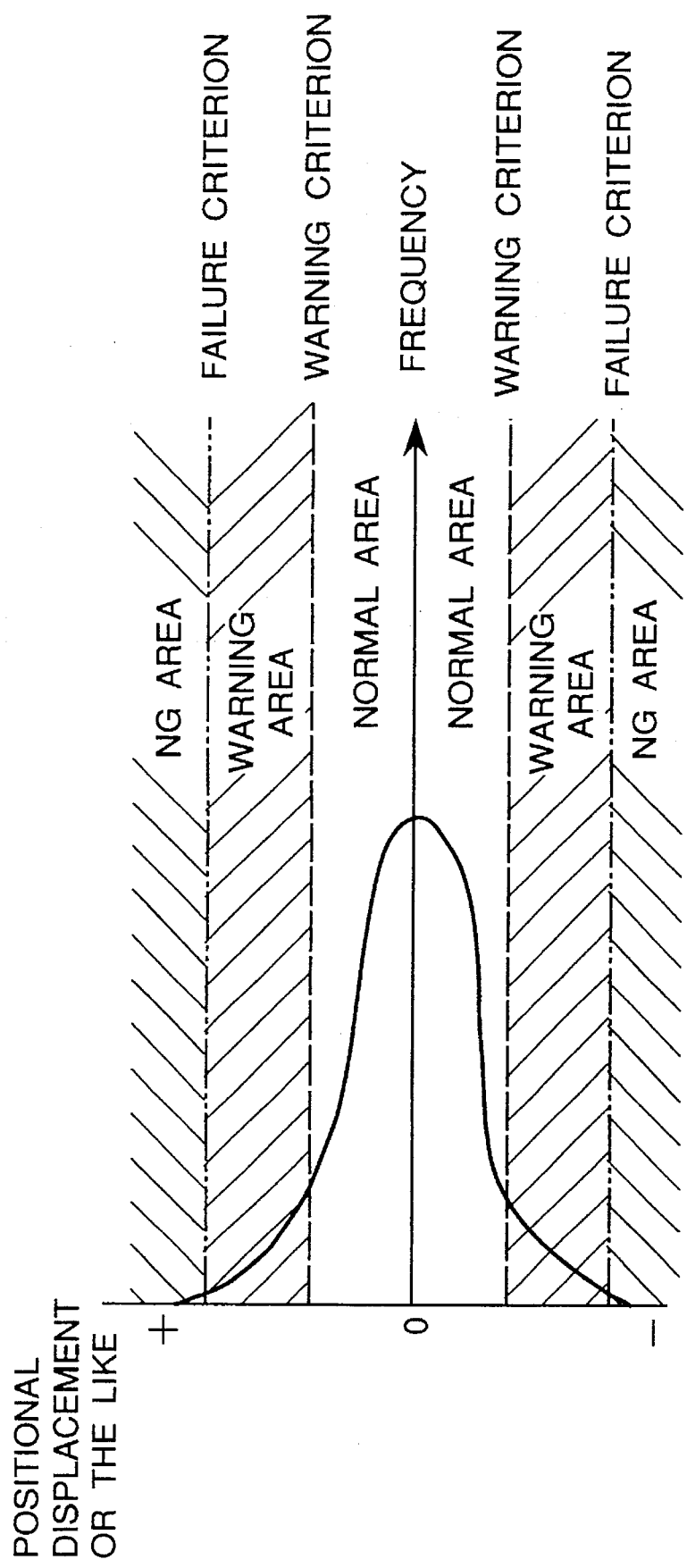
FIG. 2 is a diagram of the distribution of areas including a warning area relative to the shifting amount of measuring values.

FIG. 1H is a fifth example of an algorithm of the analyzing unit 27. The summing part 27c sums the data at the first step #140 for each combination of items of the failure decision and the warning decision in the inspecting result of printing and items of the failure decision and the warning decision in the inspecting result of mounting. Thereafter, at step #141, the generating ratio is calculated for each combination of items of the failure decision and the warning decision of the inspecting result of soldering by the summing part 27i. It is detected at step #142 whether the calculated generating ratio is high or not, namely, there is causal relation. When the existence of the causal relation is detected at step #142, the flow proceeds to step #143, and it is stored in the memory 27m to be registered as a causal relation rule. Thus, the flow is completed. When the causal relation is detected as not being present at step #142, the flow is returned back to step #141.

The operation of the producing system in the above-described constitution will now be discussed below. At step #1 in FIG. 1B in each operating process, a cream solder is printed on a land of a circuit board by the cream solder printing device 4, then, electronic components are mounted by the mounting device 7 to position leads and electrodes onto the land on which the cream solder is printed, and finally, the cream solder is reflowed in the reflow furnace 10 to bond the leads and the electrodes with the land of the circuit board. Electronic components are mounted on the circuit board in the manner as above, whereby the printed circuit board is obtained. At step #2, in each operating process, the cream solder printing inspecting device 5 inspects the printing state of the cream solder on the land (e.g., printing blur, printing shift or presence/absence of the printed solder, etc.) and moreover inspects the monitoring items related to the circuit board and the printing equipment (for example, shifting amount of the mark of the circuit board, shifting amount of the mark of the screen, etc.)

Meanwhile, the post-mounting inspecting device 8 inspects, at step #2, the mounting state of electronic components mounted by the mounting device 7 (for example, omission of electronic components, improper orientation of electronic components, displacement of the mounting position, or mounting errors in polarity of electronic components, and so on). The monitoring items related to the electronic component mounting equipment (for instance, suction errors of the suction nozzle or recognition errors) are inspected as well by the post-mounting inspecting device 8. The soldering inspecting device 11 inspects the soldering state of electronic components on the circuit board (that is, absence of electronic components, improper orientation of electronic components, displacement of the mounting position of electronic components, mounting errors in polarity of the electronic components, or the like), and also carries out inspection of the monitoring items related to the reflow facilities (specifically, temperature of the heater, speed of the conveyor, concentration of oxygen, etc.).

In the detecting process at step #2 in FIG. 1B, the inspecting data from the cream solder printing inspecting device 5 is collected and held by the printing data holding part 21, and the inspecting data from the post-mounting inspecting device 8 is collected and retained in the mounting data holding part 23, and further the inspecting data from the soldering inspecting device 11 is collected and kept in the soldering data holding part 25. In the control process at step #3, the data of the monitoring items collected in the printing data holding part 21, in the mounting data holding part 23, and in the soldering data holding part 25 are respectively subjected to summing analysis and time-series analysis, etc. in the analyzing parts 22, 24, and 26 for every monitoring item, every circuit, every equipment or the like. As a result, in accordance with the comparing result of each monitoring item with each preset warning criterion, the state of each equipment and the quality of the circuit boards passing through each equipment is detected.

Warning criterion as CIM (computer integrated manufacture) criterion is provided in addition to failure criterion as line criterion. The warning criterion is intended to provide warning when the data processed through tabulation analysis and time-series analysis in the analyzing parts 22, 24, and 26 enters a warning area although it does not reach the failure criterion, so that based on the output from the output process at step #4, the operating state of each device is changed to keep each monitoring item within the normal area, not within the warning area and not beyond the failure criterion, thus producing good products.

Figure 3:
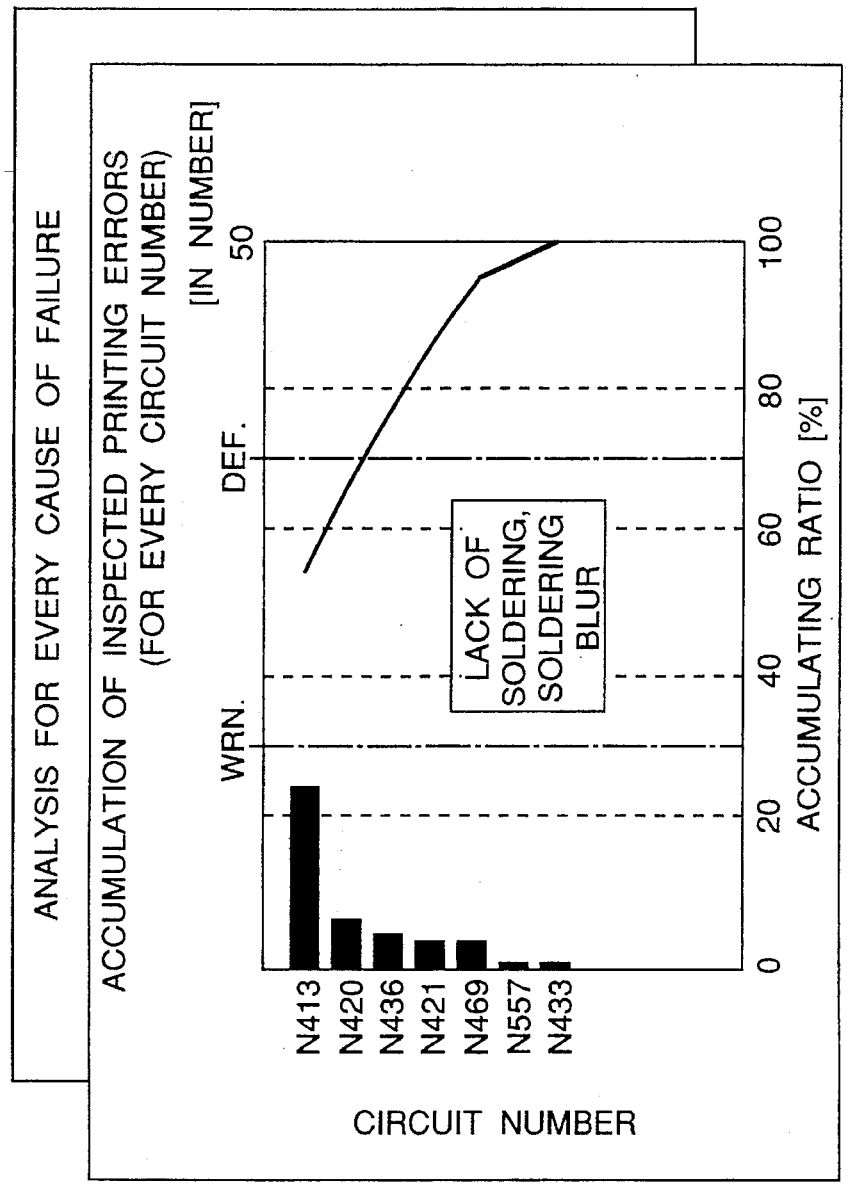
FIG. 3 is a graph of an example of the summing/analyzing result of printing errors for every circuit number in a printing data analyzing part of FIG. 1A and a display monitor showing the content of a maintenance instruction as an operation control instruction consequent to the analysis.
Figure 4:
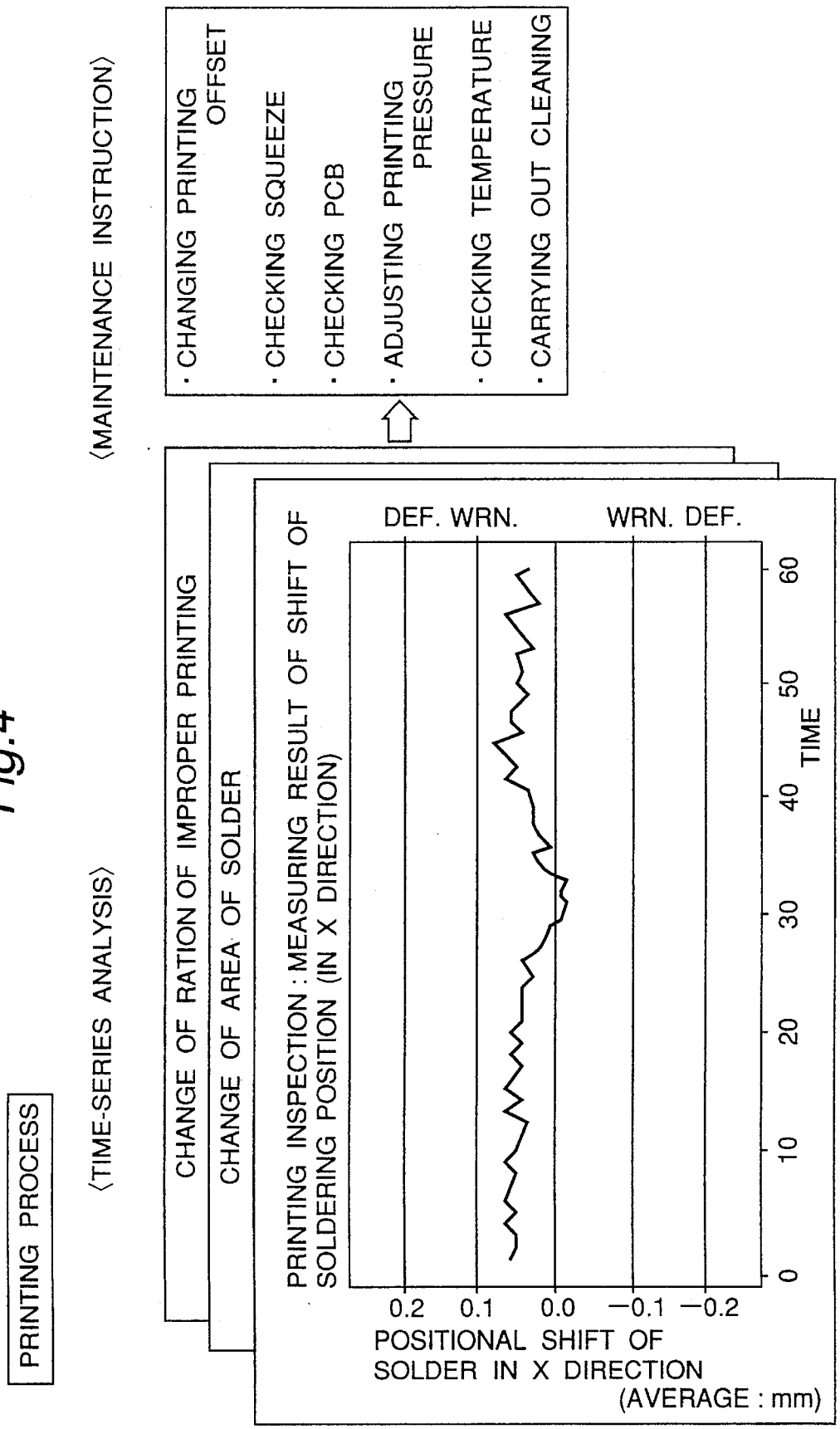
FIG. 4 is a graph of an example of the time-series analyzing result of the shift of the printing position of solder in the printing data analyzing part of FIG. 1A and a display monitor showing the content of a maintenance instruction as an operation control and a feed-back instruction each consequent to the analysis.

FIG. 3 indicates the summing/analyzing result of printing errors, namely, lack of soldering and soldering blur for every circuit number in the printing process (step #1). Warning criterion and failure criterion in the analysis of the printing errors are set corresponding to the number of errors when the lack of soldering and soldering blur reach the warning criterion. In FIG. 3, even the circuit number N413 of the largest number of errors dose not reach the warning criterion. When the warning criterion is exceeded, a maintenance instruction is issued for the circuit board and each equipment to check the squeezing pressure, inclination of the squeeze, positional accuracy of the land on the circuit board, flatness of the printed circuit board, positional accuracy and pressing amount of the screen, etc. FIG. 4 is a graph of the time-series analyzing result of the measuring value of the positional displacement of the printed solder (in the X direction), in which the warning criterion is set to be ±0.1 mm, and the failure criterion is set to be ±0.2 mm, and the measuring values are within the normal area. When the measuring value exceeds the warning criterion, i.e., ±0.1 mm, a maintenance instruction to check the squeeze, the circuit board, and the temperature is generated to each equipment and each circuit board, and simultaneously, the printing offset is changed, the squeezing pressure is adjusted, clogging of the screen is removed, that is, the printing condition of the cream solder printing device 4 is corrected to maintain the measuring value in the normal area.

Figure 5:
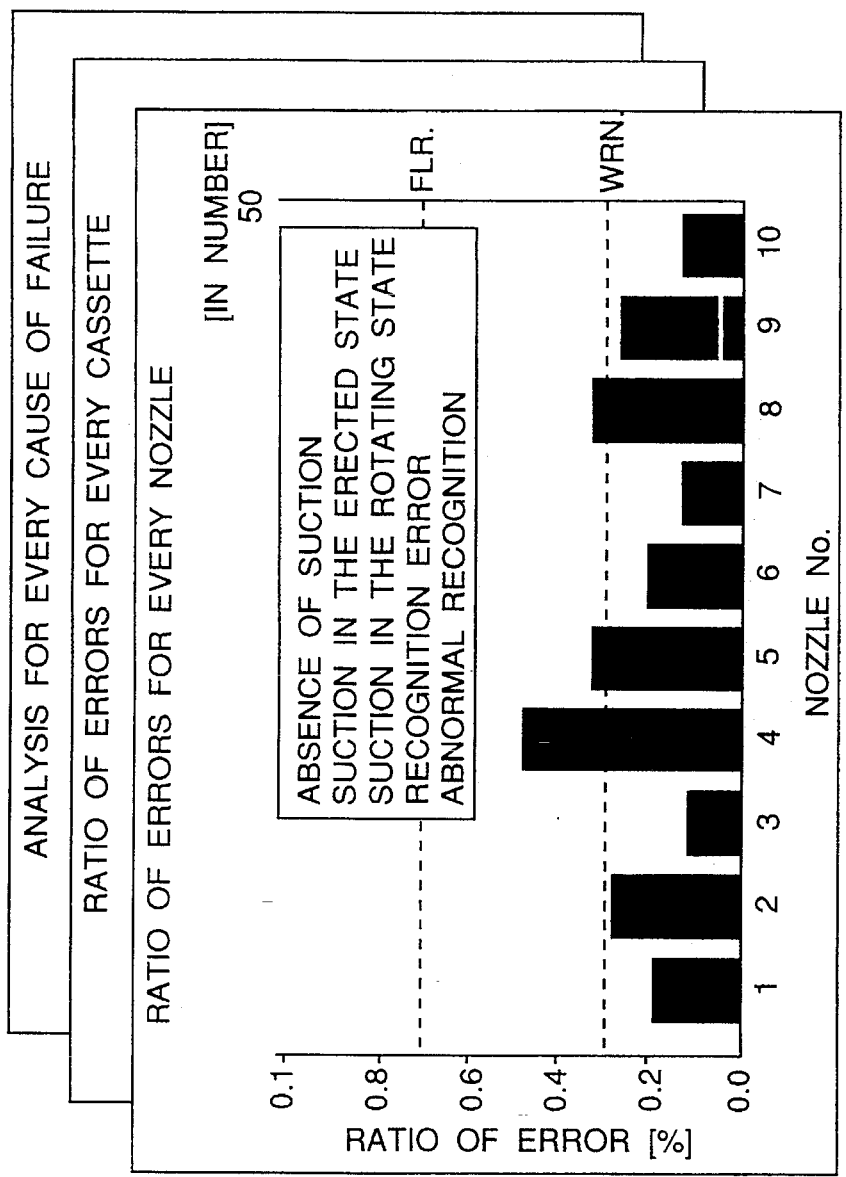
FIG. 5 is a graph of an example of the summing/analyzing result of errors for every nozzle number in an electronic component mounting data analyzing part of FIG. 1A and a display monitor showing the content of a maintenance instruction as an operation control and a feed-back instruction each consequent to the analysis.
Figure 6:
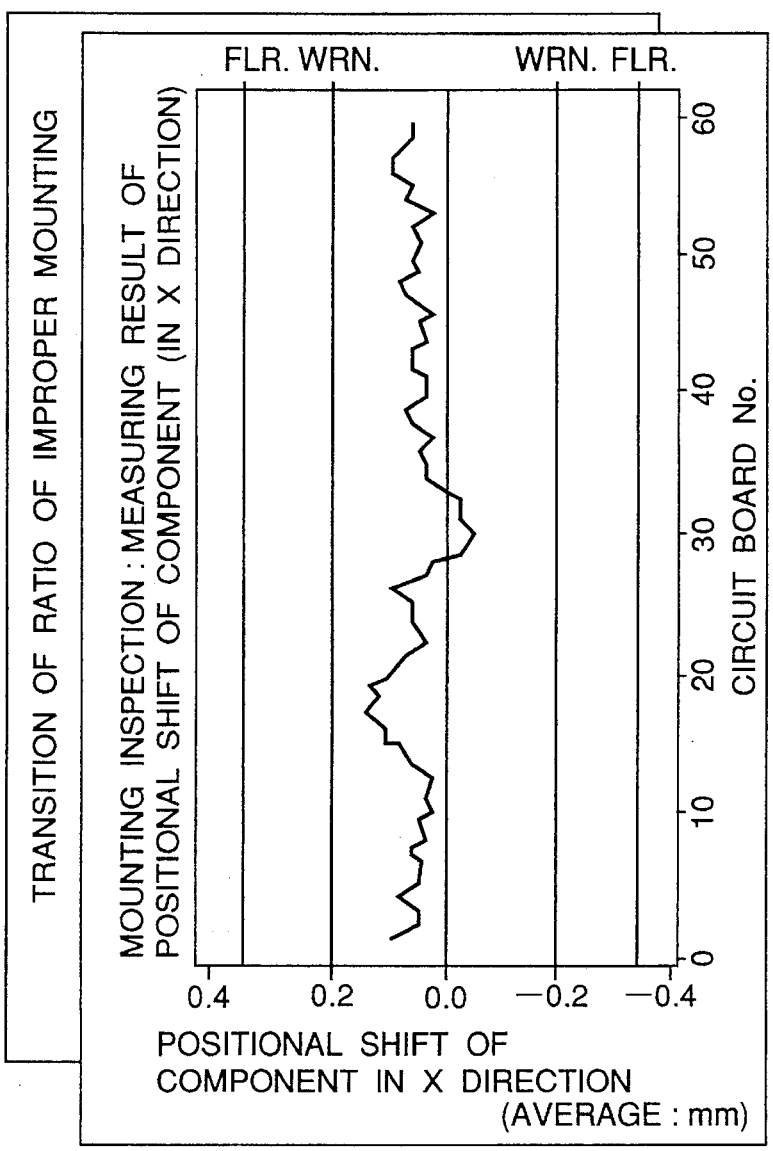
FIG. 6 is a graph of an example of the time-series analyzing result of the shift of the mounting position of electronic components in the electronic component mounting data analyzing part of FIG. 1A and a display monitor showing the content of a maintenance instruction as an operation control and a feed-back instruction each consequent to the analysis.

In the mounting process (step #1), errors in the monitoring items such as failure of suction, suction in the erecting state, suction in the erroneously rotating state, recognition error, abnormal recognition or the like are summed and analyzed for each nozzle, as shown in FIG. 5. Warning criterion and failure criterion are set in accordance with the generating number of the errors of each monitoring item when each error reaches the warning criterion. In FIG. 5, nozzles of Nos. 4, 5, and 8 exceed the warning criterion, and therefore a maintenance instruction to check the cleaning of nozzles and cassettes of each equipment is generated. Based on the check results, the filter of the mounting device 7 is exchanged to remove the clog caused by the suction of the solder, and the nozzles are cleaned. FIG. 6 is a graph of the time-series analysis of the transition of the measuring value of the displacement of the mounting position of the electronic component (in the X direction), in which warning criterion is in the range ±0.2 mm and failure criterion is set in the range of ±0.38 mm. The measuring value is within the normal area in FIG. 6. When the warning criterion is exceeded, an instruction to check a positioning reference pin to be fitted in the hole of the circuit board and to check cleaning of nozzles is outputted to the mounting device 7, and the offset of the NC data of the mounting positions of electronic components is corrected in the mounting device 7. Accordingly, the operating state of the mounting device 7 is adjusted beforehand so as to set the measuring value inside the normal area. Thus, the producing system can produce good products.

Figure 7:
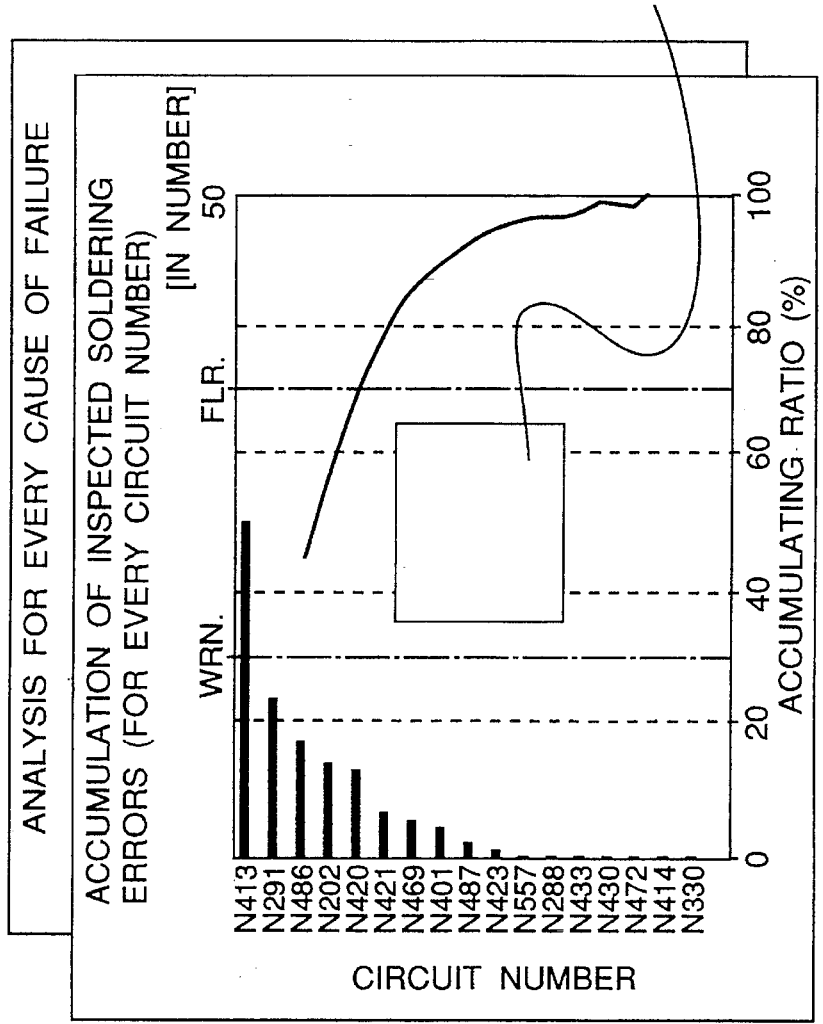
FIG. 7 is a graph of an example of the summing/analyzing result of soldering errors for every circuit number in a soldering data analyzing part of FIG. 1A and a display monitor showing the content of a maintenance instruction as an operation control and a feed-back instruction each consequent to the analysis.

Further, in the soldering process, i.e., reflow process (step #1), as indicated in FIG. 7, soldering errors such as the small height of electronic components, rotational shift in the right direction and left direction, inferior bridging, or improper detection of edge are summed and analyzed for every circuit number. Warning criterion and failure criterion are set based on the generating number of errors when each error reaches the warning criterion. In the example of FIG. 7, since the circuit number N413 of the largest number of errors exceeds the warning criterion, an instruction to check soldering, circuit board, and profile of temperature distribution of the furnace is outputted to each equipment, while the reflow conditions, namely, temperature of the heater, speed of the conveyor, and amount of N2 (concentration of O2) which influence the soldering efficiency are corrected in the reflow furnace 10. FIG. 8 shows the time-series analyzing result of the measuring value of the positional shift of the electronic component (in the X direction) detected when soldering of the electronic component is inspected. Warning and failure criteria are respectively set to be ±0.1 mm and ±0.2 mm. As the measuring value exceeds the warning criterion ±0.1 mm, it is instructed to check the profile of the temperature distribution of the furnace, circuit board, and soldering, and to correct the reflow conditions such as the temperature of the heater to the reflow furnace 10, to thereby maintain the measuring value within the normal area, that is, to produce good products.

In the output process (step #4), the analyzing unit (output part) 27 analyzes the correlation of processes related to the cause of the failure of monitoring items on the basis of the analyzing result sent from the printing data analyzing part 22, the mounting data analyzing part 24, and the soldering data analyzing part 26. Subsequently, an operation control instruction is outputted to at least any one of the cream solder printing device 4, the mounting device 7, and the reflow furnace 10 to dynamically change the operating state so as to produce good products.

Figure 9:
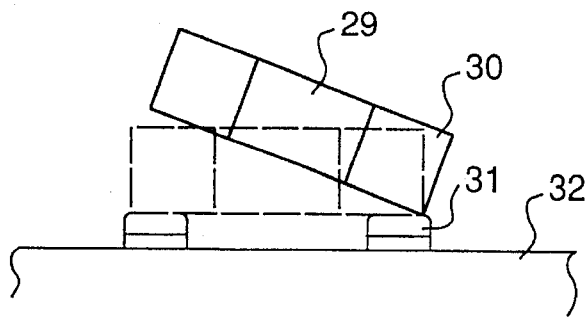
FIG. 9 is a diagram showing the state in which a chip is improperly oriented.
Figure 10:
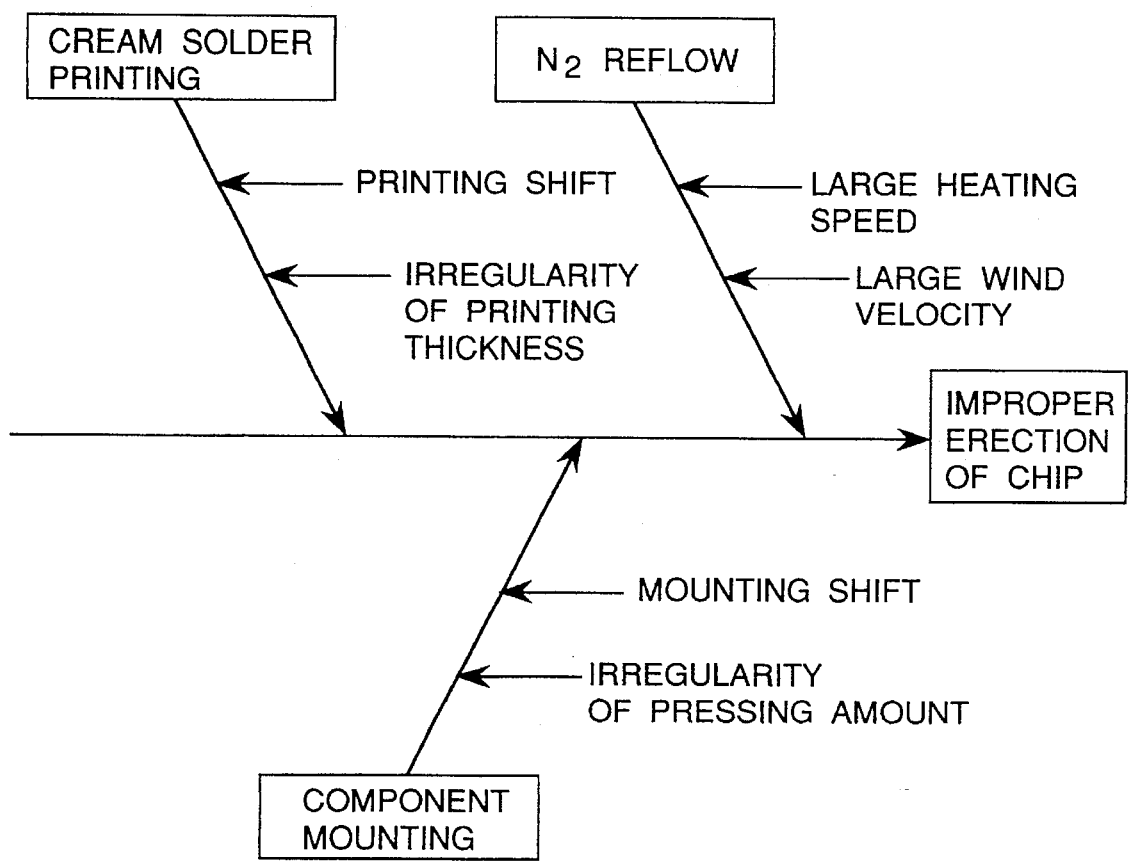
FIG. 10 is a schematic analyzing diagram of causes for the improper orientation of the chip.

More specifically, for example, regarding the correlation of the processes in the case of the improper orientation of a chip, when the heating speed is increased in the reflow process, the temperature of the solder is rapidly raised. If the printing position of the solder or the mounting position of the electronic component is shifted at this moment, a terminal 30 of a chip component 29 is shifted to the printing position of a solder 31 on a circuit board 32 as shown in FIG. 9, and consequently the chip component 29 is melted earlier at the side of smaller volume thereof because of the immediate temperature change of the solder, whereby the terminal 30 is pulled up by the caused surface tension. As a result, the chip is improperly erected at one side. As schematically explained in FIG. 10, the cause of the improper erection is found in all of the solder printing process, the electronic component mounting process, and the reflow process. However, the improper erection of the chip is not detected until the reflow process is started after the electronic component is mounted. Accordingly, in the embodiment of the present invention, the improper erection of the chip as a monitoring item is inspected in the reflow process, whereas the improper erection of the chip is corrected through analysis of the correlation of the processes in the analyzing unit 27 by means of an operation control instruction to each facility in the cream solder printing process, the electronic component mounting process, and the reflow process. That is, the printing shift, printing thickness or the like are corrected in the printing process, and the mounting shift and pressing amount, etc. are improved in the mounting process, and further the heating speed or wind velocity, etc. are adjusted in the reflow process. Thus, the operating state of each device is adjusted beforehand so as to produce good products.

In contrast, when the detecting result of the printing process is in the warning area, for example, if the printing shift is over the warning criterion, a treatment to solve the improper erection of the chip is executed in accordance with the direction and amount of the printing shift in the line further downstream than the detecting process, i.e., mounting process and reflow process before the circuit board comes to the equipment of the lower stream so as to eliminate the fear of the improper erection of the chip. Accordingly, the circuit board beyond the warning criterion detected in the printing process is protected from the improper erection of the chip and moreover, the printing process is reformed for a next circuit board corresponding to the direction and amount of the printing shift.

Figure 11:
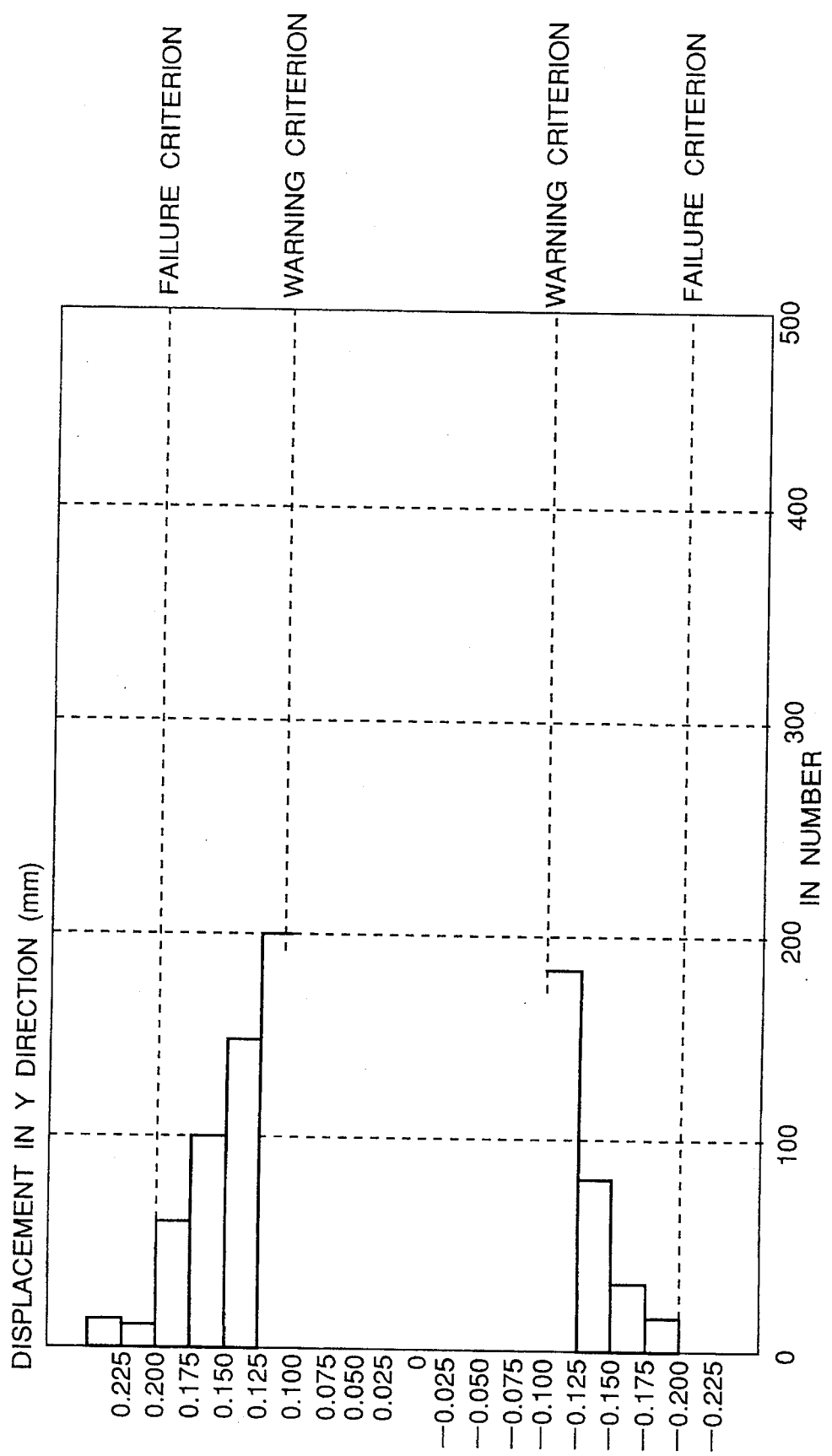
FIG. 11 is a diagram of the analysis of the distribution of measured values of the shift of the mounting position of electronic components in the warning area and an NG (no good) area.

The data for each monitoring item, every circuit, every equipment, etc. are analyzed in a summing manner, and the time-series manner in the analyzing parts 22, 24, and 26 and further the distribution analysis of the measuring values as shown in FIG. 11 (distribution of the displacement of the mounting position) is carried out. Then, the analyzing results and the analyzing result of the correlation of processes related to the cause of the failure of monitoring items obtained in the analyzing unit 27 on the basis of the analyzed results are restored in a database concurrently with the production of circuit boards, and can be displayed on a monitor or copied at any time. It is hence possible to promptly detect the true cause of the failure from various kinds of analyses from various standpoints, e.g., analyses of the quality change in a specified term, quality history in a specified term, and quality source, etc.

Figure 12:
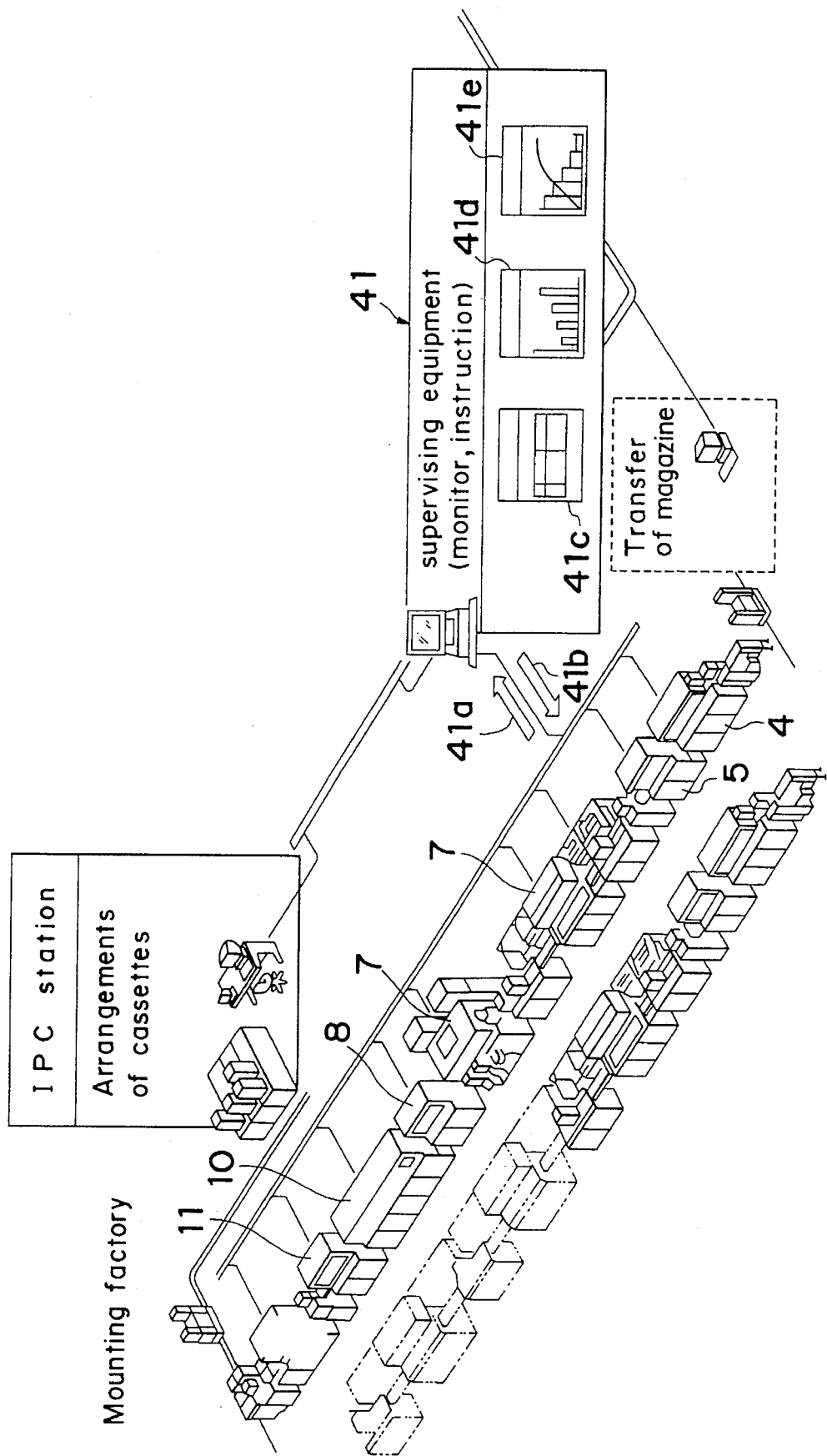
FIG. 12 is a structural diagram of the producing system of FIG. 1A.
Figure 13:
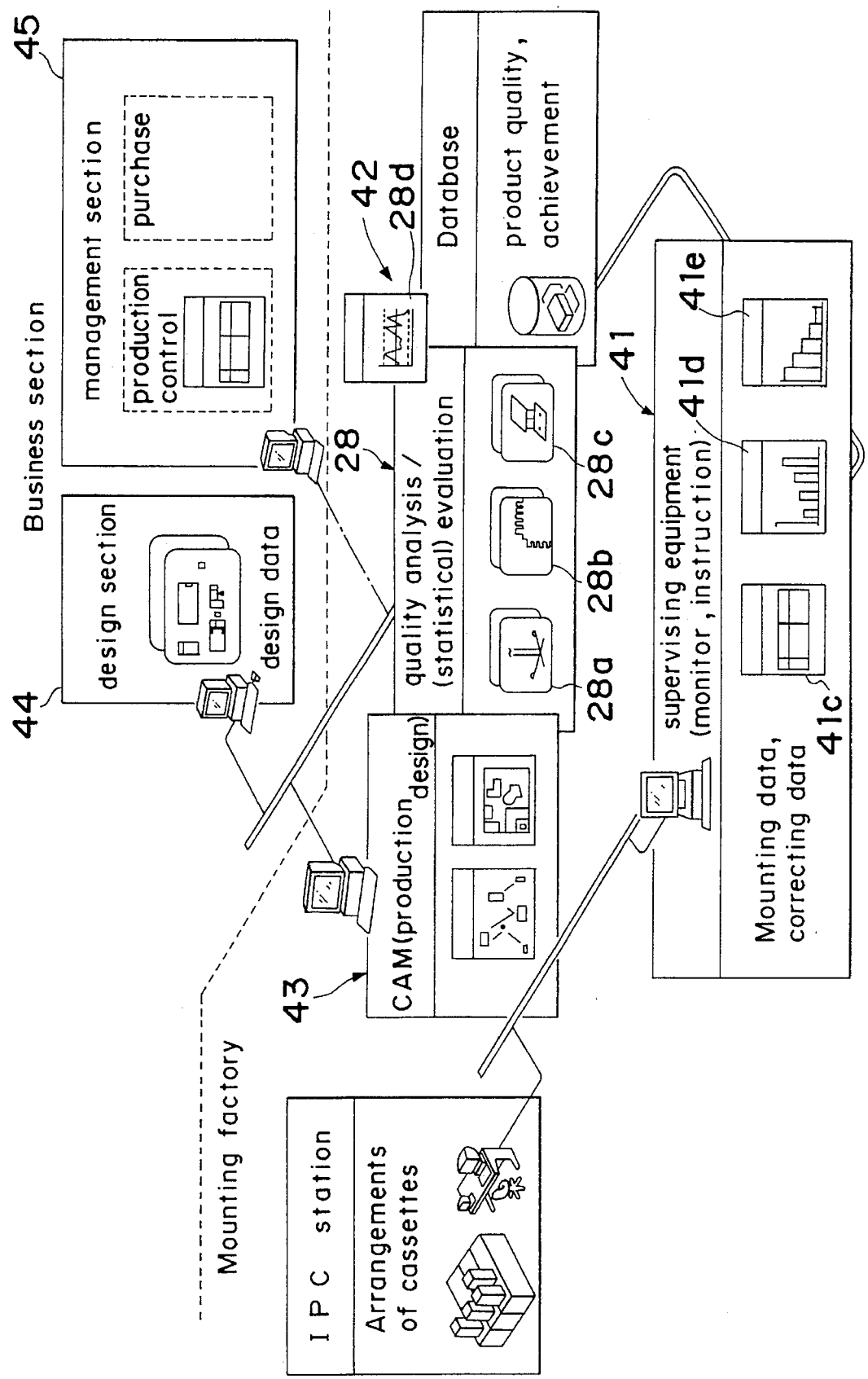
FIG. 13 is a structural diagram of the producing system of FIG. 1A in another arrangement.

FIGS. 12 and 13 are structural diagrams of the producing system of FIG. 1. There are sequentially arranged the cream solder printing device 4, the cream solder printing inspecting device 5, the mounting devices 7, the post-mounting inspecting device 8, the reflow furnace 10, and the soldering inspecting device 11 from the lower right in FIGS. 12 and 13 along the transfer line of the circuit boards. These devices and a facility monitoring unit 41 are connected in a network. As indicated by an arrow 41a, the inspecting data and the mounting data are inputted to the monitoring unit 41. Further, the mounting data and the correcting data, etc. are outputted to each device as shown by an arrow 41b. Data of a production plan 41c, a production achievement 41d, and an inventory management 41d, etc. are displayed on the monitor, enabling identification of necessary data.

A CIM station 42 is connected in a network with these devices and the monitoring unit 41. The control means 28 and a printed circuit board CAM system 43 are provided in the CIM station 42 to transmit the NC data (production design data), to monitor the line for 24 hours a day, and to analyze the product quality data (by self-analysis and monitoring). The control means 28 performs the quality analysis and the statistical evaluation on the basis of the comparison result of a printing data 28a, a recognizing data 28b, a speed setting data 28c, and a quality control data 28d, etc. with the warning criterion not exceeding the failure criterion, with outputting the result to the monitor and an operation control instruction to at least any one of the devices. Thus, the operating state of each device is dynamically changed and the good products are obtained. The result of the quality analysis and the statistical evaluation is stored in a database. On the other hand, the production design such as the mounting order, simulation of the dissolution of the soldering heat, and the like is formed in the printed circuit board CAM system 43.

Furthermore, each device, the monitoring unit 41, the CIM station 42, a design section 44, a production control section 45, etc. are connected in network with each other so as to obtain the data of the quality analysis and the statistical evaluation at a necessary time at a necessary place. In other words, the producing system of the embodiment realizes the total management of the production line through super rationalization in the MTM (manufacture total management) link owing to the efficient transmission of data between the electronic components-mounting factory (for producing various products) and the business section such as section for placing and receiving orders, the designing section, and the production control section, etc.

Since the product quality is controlled by numerical values based on the warning criterion and thus the failure can be clearly predicted based on experience, even a minute change of the measuring values of the monitoring items can be detected before it reaches the failure decision criterion. It is accordingly possible to take countermeasures in each process before the product is turned to be defective, and good products can be produced without waste.

The improper orientation of a chip called as "Manhattan Phenomenon" is discussed with respect to the analysis of correlation of processes in the foregoing description of the first embodiment. There are many monitoring items in the correlative analysis, for example, solder bridge, positional shift of electronic components as shown in FIG. 14. That is, any monitoring item for which a countermeasure should be taken in each process after the analysis of the cause of failure is an object to the correlative analysis. "FIRST" in FIG. 14 indicates the decision based on the failure criterion and "SECOND" in FIG. 14 means the decision based on the warning criterion. If a countermeasure is taken based on an improvement instruction generated in response to the decision based on the warning criterion indicated by "SECOND", the solder bridge, displacement, "Manhattan phenomenon", or the like expressed by "FIRST" can be prevented from generating in the inspection of soldering. In the embodiment, the predetermined monitoring items of the facilities and the circuit boards are detected for each of the solder printing process, the electronic component mounting process, and the reflow process. Then, the condition of facilities and the quality of the circuit boards are analyzed based on the detecting results. Then, an operation control instruction is outputted to the printing means, the electronic component mounting means, and the reflow means based on the analyzing results. Alternatively, it is possible to detect the predetermined monitoring items for arbitrary two of the three processes, or arbitrary one of the three processes. The operation control instruction may be outputted to any one of the three processes which is necessary for the analysis of the cause of the failure.

As above, according to the first embodiment, since based on the control of the warning area of the product quality the abnormality can be detected beforehand in each process before each monitoring item reaches the failure criterion, failures can be avoided and good products can be produced with strict quality reliability without waste.

As the condition of the facilities and the quality of the circuit boards are analyzed based on the comparing result of the monitoring items with the warning criterion, and the correlation of processes related to the cause of the failure of the monitoring items is analyzed on the basis of the analyzing result, it is possible to instruct countermeasures to the other processes as well as the subject process related to the cause of the failure. Accordingly, a complicated source of the failure can be correctly and promptly detected, and accurate countermeasures in correspondence with the cause of the failure in the monitoring items can be given simultaneously.

Moreover, the facilities of the process to be warned can be properly adjusted before the condition is worsened, on the basis of a maintenance instruction in response to the comparing result of the monitoring items or a combination of a plurality of monitoring items with the warning criterion.

Now, a second embodiment of the present invention will be described with reference to the accompanying drawings. The parts of the same effect and action as in the prior art will be denoted by the same reference numerals, the description of which will be abbreviated here.

Figure 15:
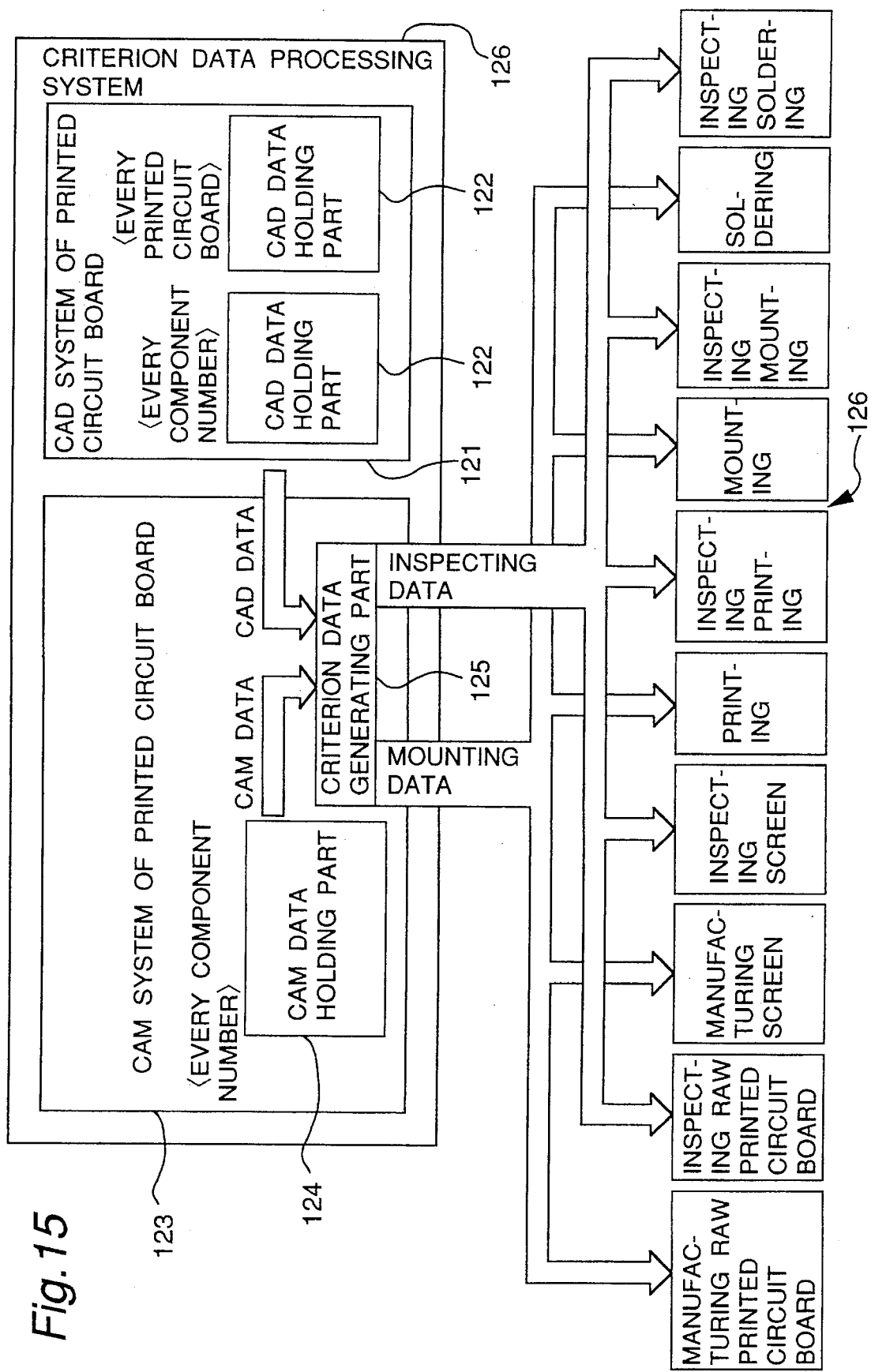
FIG. 15 is a structural block diagram of a criterion data processing system of the electronic component-mounted circuit board producing system according to a second embodiment of the present invention.

FIG. 15 is a structural block diagram of a criterion data processing system of an electronic component-mounted circuit board producing apparatus according to the second embodiment of the present invention.

Figure 20:
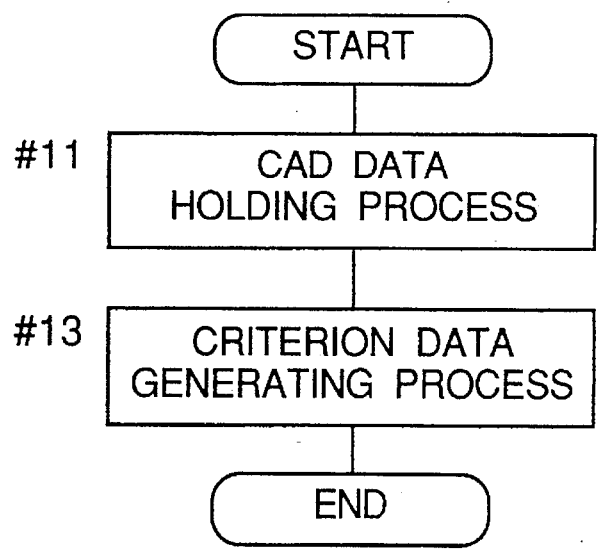
FIGS. 20 and 21 are flow charts of the criterion data processing system of FIG. 15.
Figure 21:
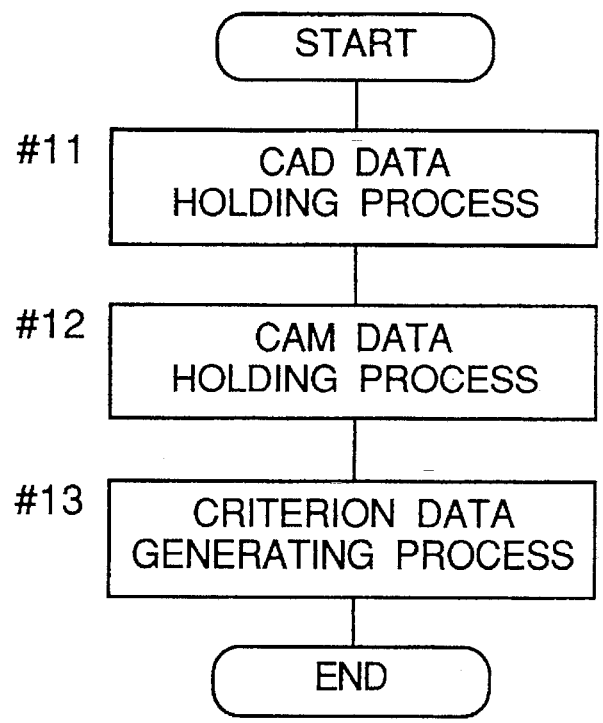
Figure 22:
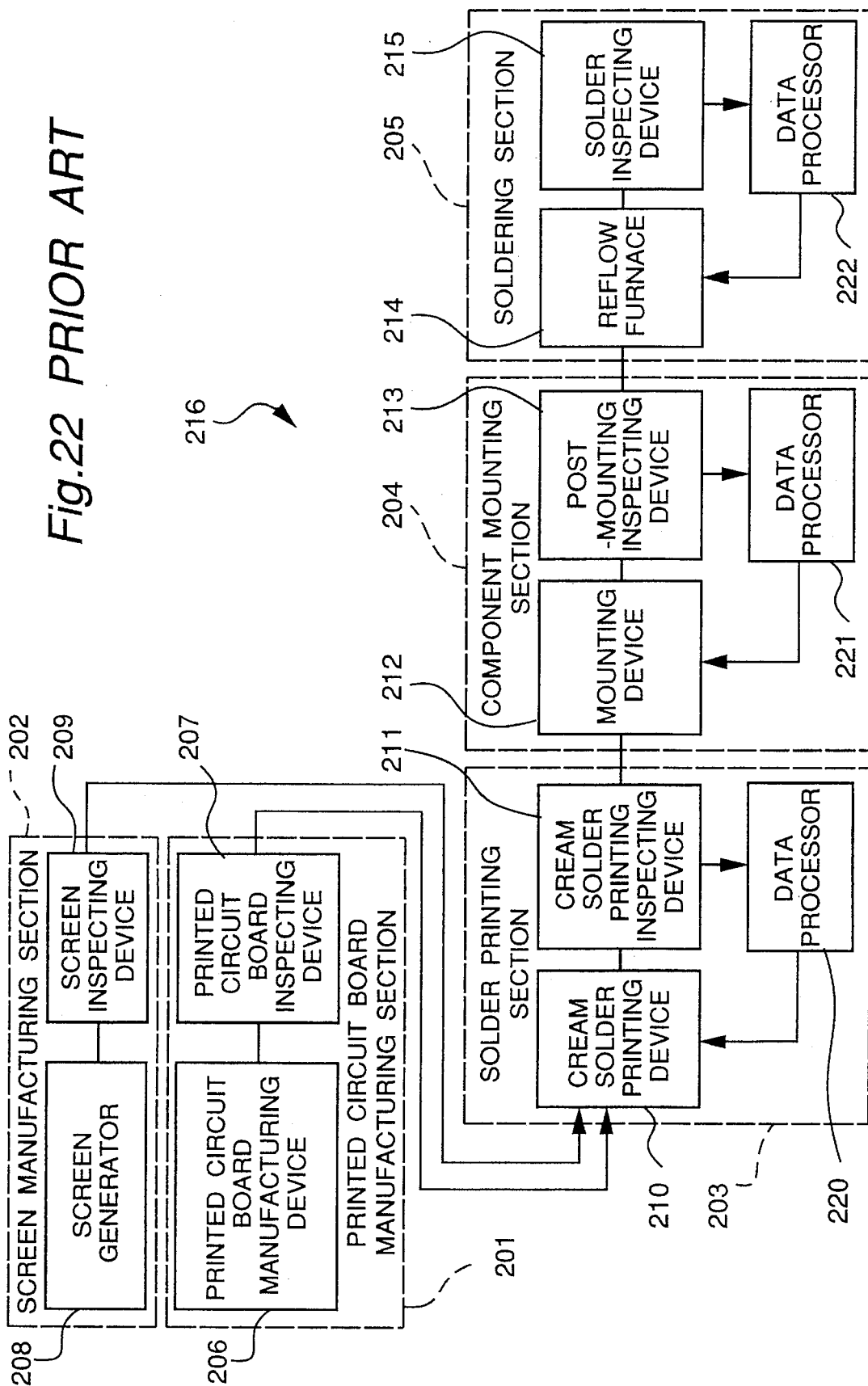
FIG. 22 is a structural block diagram of a conventional electronic component-mounted circuit board producing apparatus.
Figure 23B:
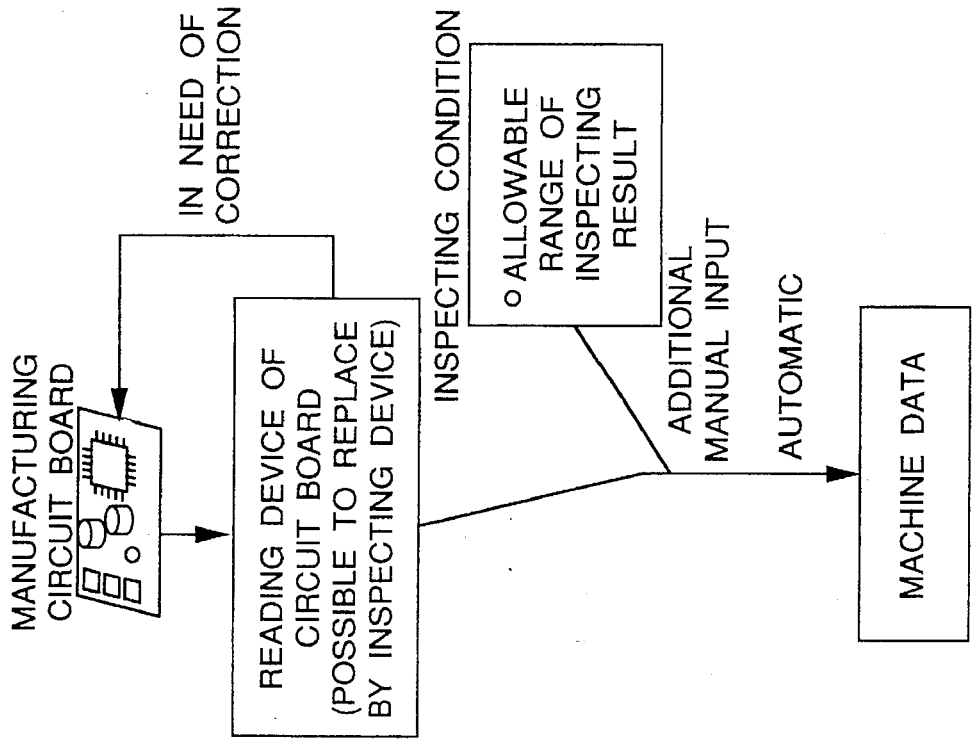
FIGS. 23A and 23B are block diagrams showing the manner of forming inspecting data in a conventional manner.
Figure 23A:
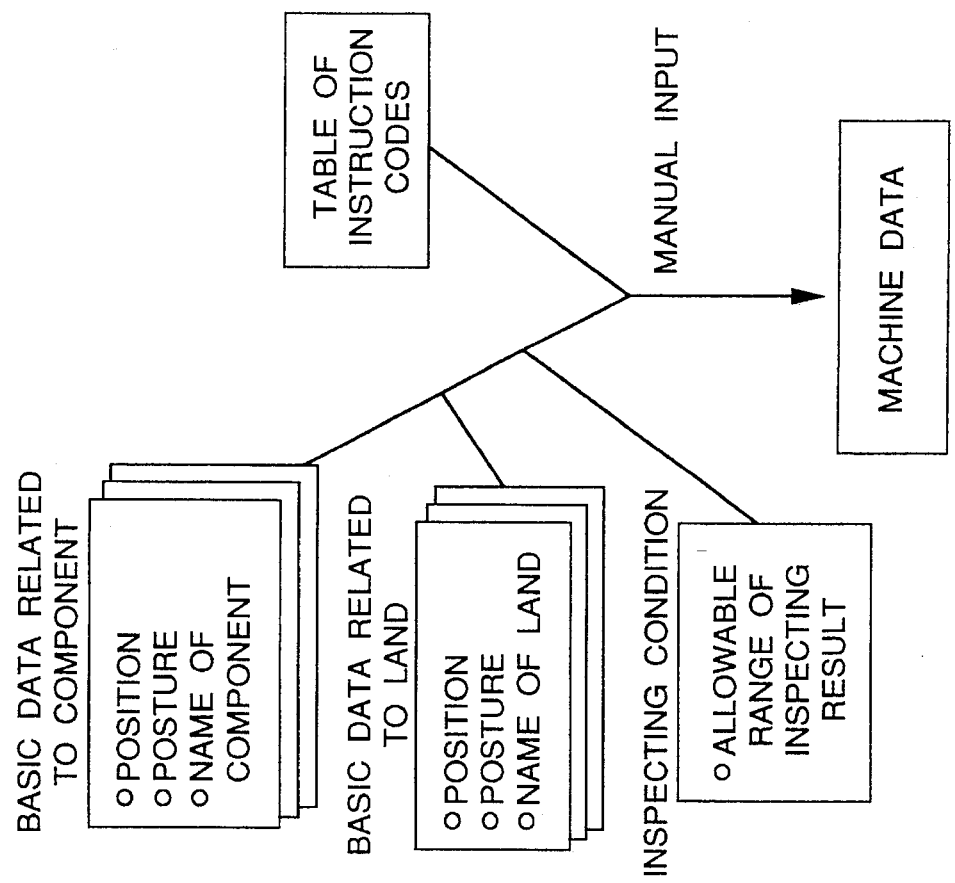
Figure 24:
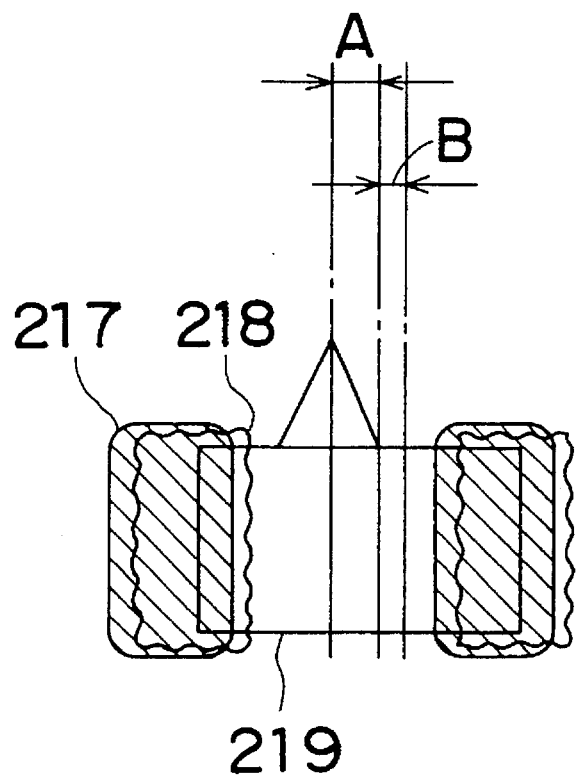
FIG. 24 is a diagram showing the correlation of the positional shift of a land, printed cream solder, and an electronic component inspected in an actual case.

As shown in FIGS. 20 and 21, the second embodiment includes a CAD data holding process (step #11) and a criterion data generating process (step #13), with a CAM data holding process (#12) inserted between steps #11 and #13 as necessary.

In FIG. 15, a printed circuit board CAD system 121 simulates and determines the layout of elements to be used in a target circuit board with referring to a table of the material of electronic components. The kind and the position of a land corresponding to the position and the shape of pins of each element are obtained from the layout, so that a circuit pattern of the printed circuit board is designed. Besides, a mask pattern is also designed. The printed circuit board CAD system 121 has a CAD data holding part 122. The CAD data holding part 122 holds the basic data of the land such as land pattern data including the name, the kind, the position, and the posture, etc. of the land, the basic data of electronic components including the name and the kind of the electronic components corresponding to the land, the name called as a circuit number to distinguish the electronic components on the circuit board, and the position to be mounted the posture, the mask pattern data, etc. for every printed circuit board. The CAD data holding part 122 also holds the mask data and the land data for every electronic component number.

A printed circuit board CAM system 123 is provided with a CAM data holding part 124. The CAM data holding part 124 holds CAM data for every electronic component number which are previously inputted by an operator, such as the database of the inspecting condition of circuit boards, screen, printing condition, mounting condition, soldering condition; and the database of the operating condition of each device; the database of electronic components; and the database of solder fillet configurations. The printed circuit board CAM system 123 is further provided with a criterion data generating part 125 to which the CAD data and CAM data are respectively inputted from the CAD data holding part 122 and the CAM data holding part 124. The criterion data generating part 125 generates an inspecting data for actuating the inspecting devices in each process and also a mounting data for operating the production facilities in each process.

A criterion data processing system 126 of an electronic components-mounted circuit board producing apparatus 116 is constituted in the above manner, whereby the printed circuit board and the screen are produced, the solder is printed on the land of the printed circuit board with the use of the screen, and electronic components are mounted at predetermined positions of the printed solder, and the land is soldered to the terminals of the electronic components. The system 126 forms the mounting data and the inspecting data for operating the production facilities and the inspecting devices in each process of the producing apparatus 116 as a production line unified criterion on the basis of the CAD data.

The inspecting data outputted from the criterion data generating part 125 are target values, for instance, area and shape of each land of the cream solder; mounting positions and angles of electronic components; electronic components to be mounted; shape and volume of the solder fillet; numerical values for specifying the allowable ranges to the target values; and the inspecting algorithm and conditions (e.g., optical conditions); etc. The mounting data generated from the criterion data generating part 125 are target values when the electronic components are mounted, for instance, X-Y coordinates, angles, numbers of electronic components, and operating conditions at the mounting time of electronic components, etc. The inspecting data becomes criterion values to be inputted to the inspecting devices in each process to operate the inspecting devices, while the mounting data are criterion values to be inputted to the devices in each process to operate the devices.

Figure 16:
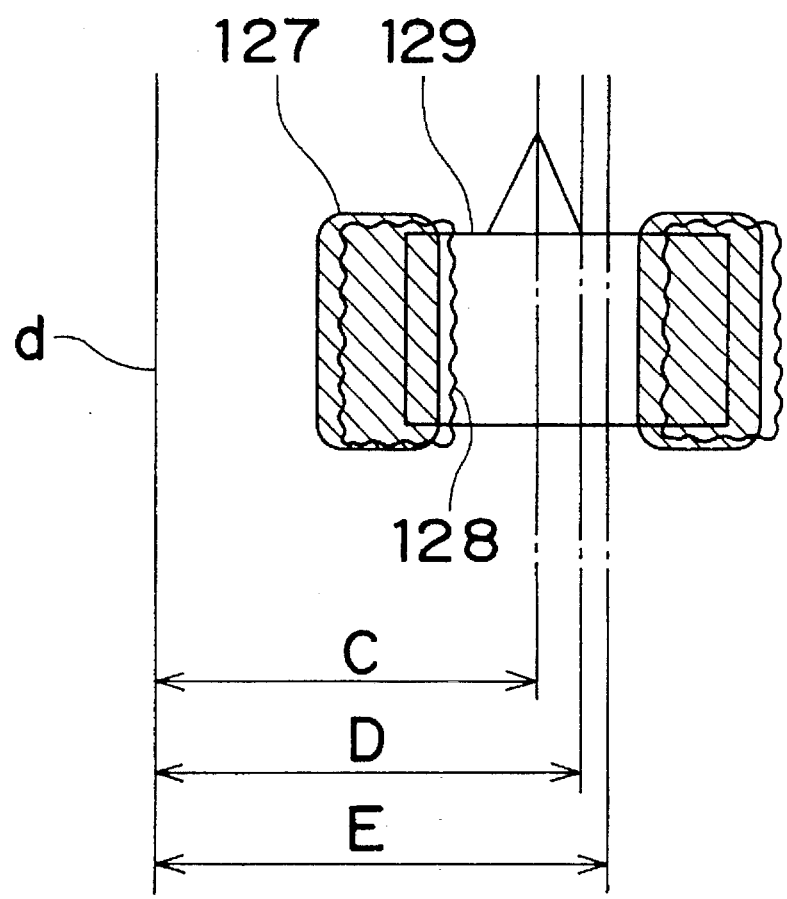
FIG. 16 is a diagram showing the shift of a land, printed cream solder, and an electronic component to the unified criterion in the criterion data processing system of FIG. 15.

FIG. 16 shows the displacement of the land, the printed cream solder, and the electronic component to the unified criterion in the criterion data processing system of FIG. 15. In FIG. 16, (C) represents the displacement between the CAD data (d) as the unified criterion and a land 127, (D)

indicates the displacement between the CAD data (d) and a printed cream solder 128, and (E) indicates the displacement between the CAD data (d) and an electronic component 129.

Figure 17:
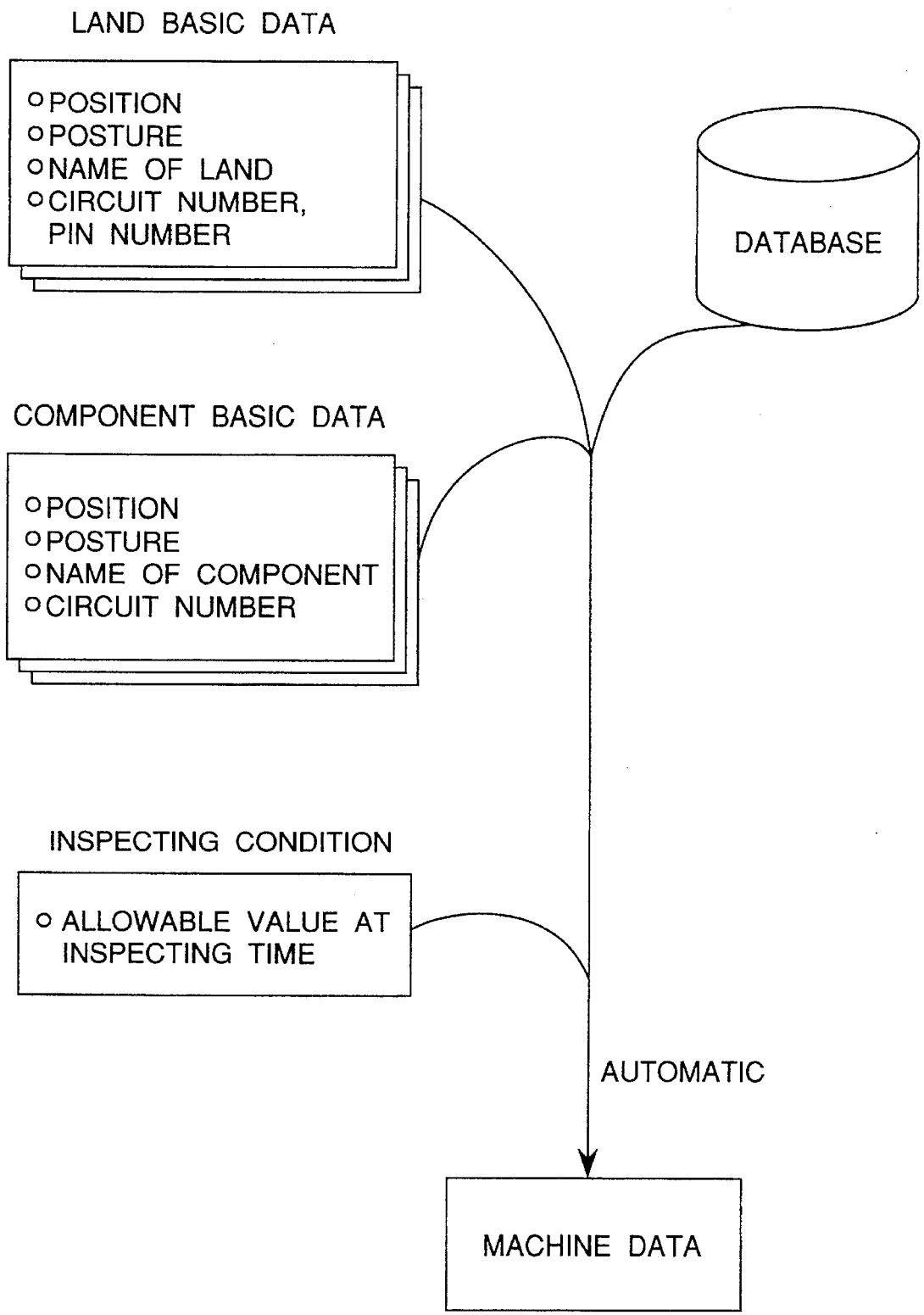
FIG. 17 is a diagram of the manner in which inspecting data and mounting data are formed in the criterion data processing system of FIG. 15.

FIG. 17 is a diagram of the concept to form the inspecting data and the mounting data in the criterion data processing system of FIG. 15. As is understood from FIG. 17, when the land basic data such as names, kinds, positions to be inspected and postures to be inspected of lands to be inspected and mounted; the electronic component basic data such as names or, kinds of electronic components corresponding to the lands, the circuit numbers for distinguishing the electronic components on the circuit board individually, positions to be mounted, and postures to be mounted; the data of inspecting conditions which designates a code related to the allowable value at the inspecting time; and the operating data of the production equipment, etc. are inputted, a machine data for automatically operating the inspecting devices and other equipment is formed based on the suitable database. Since it is generally impossible to physically overlap and mount the electronic components on the circuit board, the circuit numbers may be substituted with mounting coordinate values if the electronic components can be distinguished by the mounting coordinate values.

Figure 18:
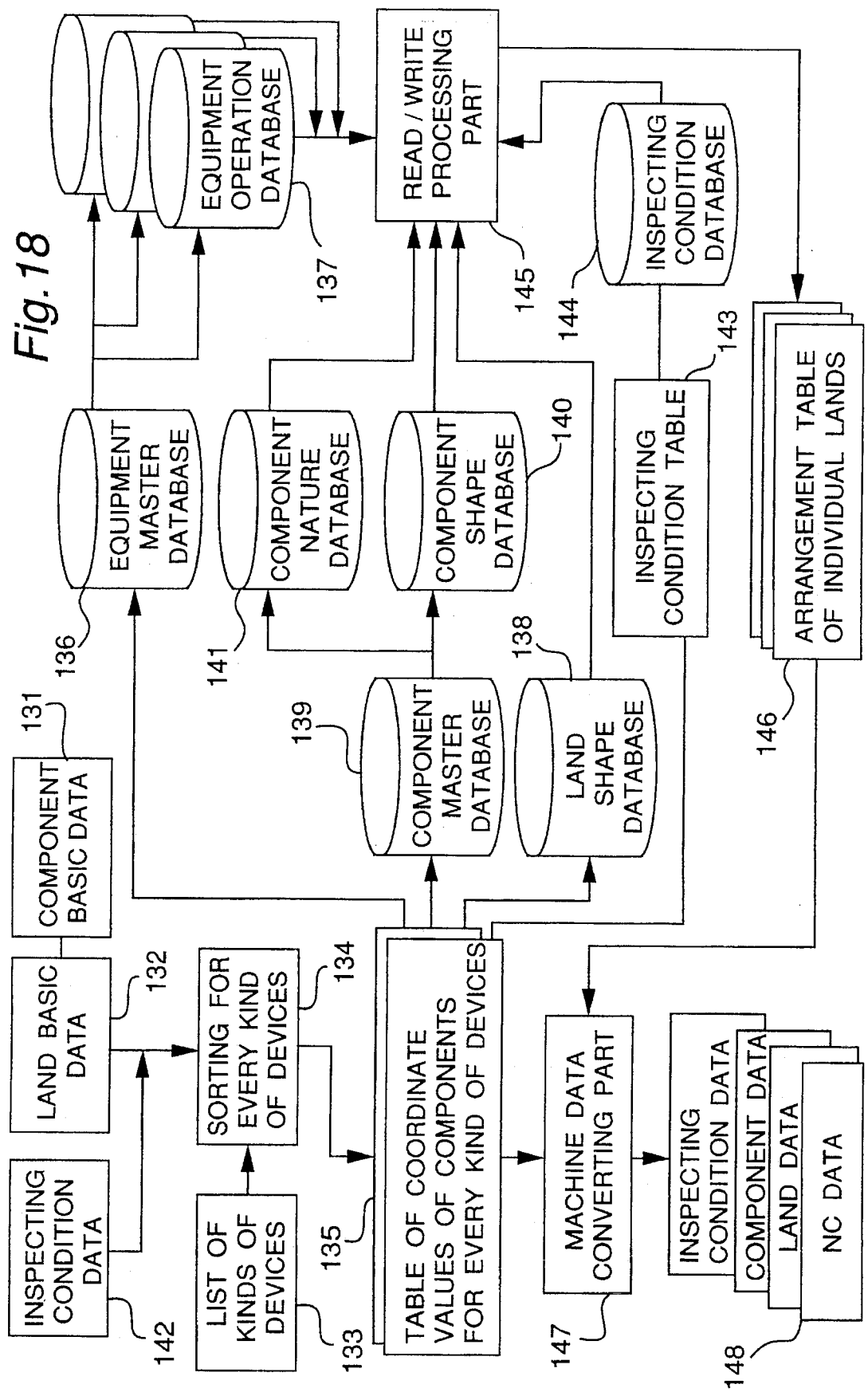
FIG. 18 is a block diagram of an example of the flow of data in a criterion data generating part of FIG. 15.

FIG. 18 is a block diagram of an example of the flow of data in the criterion data generating part 125 of FIG. 15, wherein 131 denotes the electronic component basic data related to electronic components to be inspected or mounted, and 132 indicates the land basic data related to lands. Both data is the criterion data supplied as the CAD data. The land basic data 132 shows which of the electronic component and which of the pins of the electronic component the subject land corresponds to, by means of a pair of the circuit number and the pin number. Therefore, the land basic data handles the circuit number and the pin number in pairs.

With reference to a list 133 of kinds of the devices in each process, lands to be inspected are sorted for every kind of devices in each process by a sorter 134, based on the land basic data 132. Then, a table 135 of the land coordinate values for every kind of devices in each process is formed based on the land basic data 132. In the table 135, the lands to be inspected for every kind of devices in each process, coordinate values of the positions of the lands to be inspected, and pairs of circuit number and pin number of electronic components corresponding to the lands are recorded.

When the table 135 is formed, an equipment operating database 137 is accessed via an equipment master database 136 on the basis of the data specifying the kind of devices. As a result, the data related to the operating characteristics of the device of the specific kind is read out. The equipment master database 136 records access addresses to an equipment operating database 137 for each kind of devices, and the equipment operating database 137 records data of the operating characteristics for every equipment in each process which influences the inspecting operation in each process.

On the basis of the kind or the name of the lands recorded in the table 135, a land shape database (land database) 138 is accessed to read the data related to the shape of lands for every kind of land. That is, the land shape database 138 records the data related to various types of shapes of lands. Moreover, through an electronic component master database 139 which constitutes an electronic component database, an electronic component shape database 140 is accessed based on the kind or name of the electronic components corresponding to the lands recorded in the table 135, thereby to read out the data related to the shape of electronic components for every kind of electronic components. Similarly, an electronic component nature database 141 is accessed through the electronic component master database 139, and the data related to the color of electronic components or the like is read out for every kind of electronic components. The electronic component master database 139 records further access addresses to the electronic component shape database 140 and the electronic component nature database 141. The electronic component shape database 140 records data of various types of shapes of electronic components, and the electronic component nature database 141 records data of physical properties of the electronic components, for example, color, weight and the like except for the shape.

An inspecting condition table 143 is formed for each land recorded in the table 135 by inputting the inspecting conditions of the lands on the basis of information items of an inspecting condition data 142 inputted as the CAM data from the CAM data holding part 124. Since the allowable condition at the inspecting time may differ depending on the position of the land on the circuit board even when the land name is the same, it is impossible to define the inspecting condition for every land name or every kind of land, not alike the land shape. Therefore, an inspecting code to represent the inspecting condition for each land is set in the inspecting condition table 143. The inspecting codes in the inspecting condition table 143 correspond to the access addresses to an inspecting condition database 144 which records data related to the inspecting condition such as the actual allowable value at the inspecting time, etc.

A read/write processing part 145 sequentially reads out predetermined data from the above various kinds of databases based on the table 135, while an individual land arrangement table 146 is formed on the basis of the data read by the read/write processing part 145. In the arrangement table 146 is written the data of the kind of inspecting devices in each process, the kind of lands to be inspected, and the inspecting condition of lands for every electronic component.

When the individual land arrangement table 146 is formed as above, the name and the coordinate values of the inspecting position of each land are read out from the table 135, and the data read from the table 146 on the basis of the circuit number and the pin number in pairs and the name of the electronic component is converted to machine data 148 by a machine data converting part 147. The machine data 148 includes NC data corresponding to the coordinate values, electronic component data corresponding to the kind of electronic components, land data indicating the shapes of lands, inspecting condition data showing the allowable condition at the inspecting time, etc.

Although it is possible to process the data as above for every land, the data may be processed for every electronic component in order to enhance the compatibility with the formation of the mounting data. In general, the inspecting devices are often used concurrently with the production facilities in each process, and the inspecting data is processed for every electronic component in many cases. Therefore, it is more convenient to process the inspecting data for every electronic component. Moreover, the processing amount of data can be reduced more if the data is processed for every electronic component, not for every land of a plurality of lands present in each electronic component.

Figure 19:
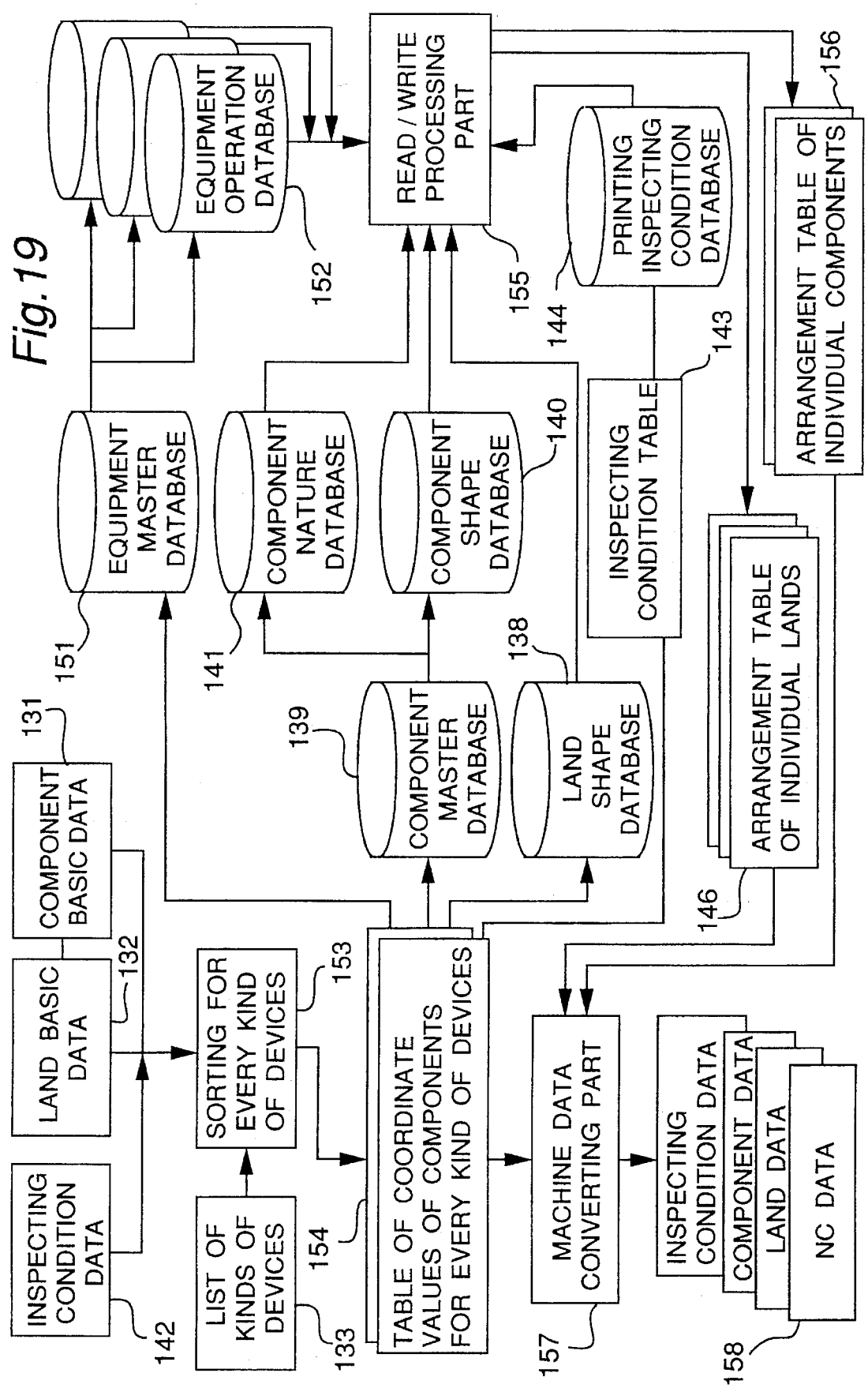
FIG. 19 is a block diagram of another example of the flow of data in the criterion data generating part of FIG. 15.

FIG. 19 indicates an example of forming the machine data for a mounting system from a common electronic component database. In this example of FIG. 19, a memory database for storing the characteristics of each mounting system influencing the mounting operation, an access means for making access to an equipment database for every mounting system, and a machine data converting means for the mounting system are added.

FIG. 19 is a block diagram of the example of the flow of data in the criterion data generating part 125 of FIG. 15, which is a modification of FIG. 18. A mounting equipment address is additionally set in an equipment master database 151, and the criterion data for every kind of mounting equipment is registered in an equipment operating database 152. A sorter 153 sorts the inspecting devices and the mounting equipment for each electronic component and loads the data of both the inspecting device and the mounting equipment in an electronic component coordinate value table 154 which records coordinate values of electronic components for every kind of inspecting device and mounting equipment while the sorter 153 separately sorts the kinds of inspecting devices and mounting equipment for every component. The corresponding land data is extracted from the land shape database 138 on the basis of the data included in the land basic data 132 while referring to the component. A read/write processing part 155 forms an electronic component arrangement table 156 in addition to the individual land arrangement table 146. The kind of the mounting equipment for each electronic component and the kind of electronic components to be mounted are indicated in the arrangement table 156. If another converting means for the mounting equipment is added corresponding to the electronic component arrangement table 156 to a machine data converting part 157 so as to simultaneously form the NC data for the mounting system in a machine data 158, not only the inspecting data for the inspecting devices, but the mounting data for the mounting equipment can be formed at the same time. In this case, the electronic component master database 139 determined by the name and the kind of electronic components, the electronic component shape database 140, and the electronic component nature database 141 can be utilized in common.

The CAD data such as the land basic data and the electronic component basic data used when the circuit pattern of the printed circuit board is designed is retained by the CAD data holding part 122 of the CAD system 121. The criterion data generating part 125 automatically forms the inspecting data and the mounting data based on the CAD data. Therefore, the criterion of the mounting data and the inspecting data which has been conventionally inputted manually by the operator with the help of eyesight based on the actual printed circuit board is not required. The CAD data is employed as the production line unified criterion of the producing apparatus 116 seen from the total viewpoint of the production system, having high accuracy and density, and being capable of producing good products. The screen data, the land data, the electronic component data, the inspecting data of printed circuit boards, the printing inspecting data, the electronic component mounting data, the mounting inspecting data, and the soldering inspecting data, etc. are formed based on the CAD data, so that the irregularity and ambiguity inherent in the prior art can be eliminated, and good circuit boards can be produced precisely on the basis of the design data. Since the manufacturing criterion and the inspecting criterion are unified by the CAD data as the production line unified criterion, it becomes possible to secure the inspecting criterion from upstream of the production line such as the manufacturing process of printed circuit boards, and the manufacturing process of the screen, to thereby correctly inspect the printing, mounting, and soldering processes downstream of the line. Thus, the strict quality of the circuit boards can be ensured. Moreover, since the product quality is controlled in each process from the source of the line and thus the products are processed with high quality, circuit boards of high quality are obtained at the final stage. The cause of the failure can be easily detected and solved for every process.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A system for producing a circuit board having electronic components mounted, comprising:

a printing device for printing solder on lands of the circuit board;

an electronic component mounting device, operatively positioned downstream of said printing device, for mounting the electronic components on the circuit board at predetermined positions of the solder printed on the lands of the circuit board;

a soldering device, operatively positioned downstream of said electronic component mounting device, for soldering the lands of the circuit board to respective terminals of the electronic components mounted on the circuit board;

monitored items detecting means for detecting predetermined items to be monitored including predetermined characteristics of the circuit board and predetermined operating states of at least one of said printing device, said electronic component mounting device, and said soldering device;

control means for analyzing an operating condition of system and an assembly quality of the circuit board based on a result of a comparison between the monitored items detected by said monitored items detecting means and predetermined warning criterion, said warning criterion being less than predetermined failure criterion; and monitoring means for outputting an analyzing result of said control means to a monitor.

2. The system as claimed in claim 1, wherein said control means includes:

a data holding part for holding data indicative of the monitored items detected and outputted by said monitored items detecting means;

a data analyzing part for analyzing the operating condition of the system and the assembly quality of the circuit board based on the data held by said data holding part; and an output part for outputting an operation control instruction to at least one of said printing device, said electronic component mounting device, and said soldering device on the basis of an analyzing result of said data analyzing part to dynamically change and control an operating state of the device to which the instruction is inputted.

3. The system as claimed in claim 1, wherein said control means includes:

a data holding part for holding data indicative of the monitored items detected and outputted by said monitored items detecting means;

a data analyzing part for analyzing the operating condition of the system and the assembly quality of the circuit board based on the data held by said data holding part; and an output part which, when said data analyzing part determines that data indicative of the monitored items associated with one of said devices exceeds the warning criterion and does not exceed the failure criterion, outputs an operation control instruction to devices upstream and downstream of said one of said devices to dynamically change and control an operating state of said upstream and downstream devices.

4. The system as claimed in claim 1, wherein said control means includes:

a data holding part for holding data indicative of the monitored items detected and outputted by said monitored items detecting means;

a data analyzing part for analyzing the operating condition of the system and the assembly quality of the circuit board based on the data held by said data holding part; and an analyzing part which analyzes a correlation between processes carried out by said devices and causes of failures of the monitored items on the basis of an analyzing result of said data analyzing part, and then outputs an operation control instruction to at least one of said printing device, said electronic component mounting device, and said soldering device to dynamically change and control an operating state of device to which the instruction is inputted.

5. The system as claimed in claim 1, wherein said control means includes:

a data holding part for holding data indicative of the monitored items detected and outputted by said monitored items detecting means;

a data analyzing part for analyzing the operating condition of the system and the assembly quality of the circuit board based on the data held by said data holding part; and a correlation analyzing part which issues a maintenance warning based a comparison result between the warning criterion and one or a combination of the monitored items in the data analyzing part.

6. The system as claimed in claim 1, further comprising:

a CAD data holding part for holding CAD data including land basic data and an electronic component basic data used upon design of a circuit pattern of the circuit board;

a criterion data generating part which employs the CAD data retained by the CAD data holding part as a production line unified criterion of said system, and generates mounting data and inspecting data used to operate said printing device, said electronic component mounting device, and said soldering device on the basis of the CAD data.

7. The system as claimed in claim 1, further comprising:

a CAD data holding part for holding CAD data including land basic data and an electronic component basis data used upon design of a circuit pattern of the circuit board;

a CAM data holding part for holding CAM data of an operating condition and an inspecting condition of said system; and a criterion data generating part which employs the CAD data retained by the CAD data holding part as a production line unified criterion of said system, and generates mounting data and inspecting data used to operate said printing device, said electronic component mounting device, and said soldering device on the basis of the CAD data and the CAM data.

8. A method of producing a circuit board on which an electronic component is mounted, comprising:

applying the circuit board to assembly line equipment which effect predetermined assembly processes including printing solder on a land of the circuit board, mounting the electronic component on the circuit board at a predetermined position of the solder, and soldering the land of the circuit board to a terminal of the electronic component;

detecting predetermined items to be monitored, including predetermined operating states of the assembly line equipment and predetermined characteristics of the circuit board, of at least one of the printing, mounting, and soldering processes;

analyzing an operating condition of the assembly line equipment and a quality of the circuit board on the basis of a comparison between warning criterion, which are less than failure criterion, and the monitored items detected in said detecting step; and outputting an analyzing result obtained in said analyzing step to a monitor.

9. The producing method as claimed in claim 8, wherein said analyzing step includes outputting an operation control instruction to at least one of a printing device, an electronic component mounting device, and a soldering device based on the analyzing result to dynamically change and control an operating state of the device to which the instruction is inputted.

10. The producing method as claimed in claim 8, further comprising when the monitored items associated with one of plural devices of said assembly line equipment exceeds the warning criterion and does not exceed the failure criterion, outputting an operation control instruction to devices upstream and downstream of said one of said devices to dynamically change and control an operating state of said upstream and downstream devices.

11. The producing method as claimed in claim 8, further comprising analyzing a correlation between the processes carried out by said assembly line equipment and causes of failures of the monitored items, and then outputting an operation control instruction to at least one of a printing device, an electronic component mounting device, and a soldering device to dynamically change and control an operating state of the device to which the instruction is inputted.

12. The producing method as claimed in claim 8, further comprising issuing a maintenance warning based on a comparison result between the warning criterion and one or a combination of the monitored items in the analyzing.

13. The producing method as claimed in claim 8, further comprising:

storing CAD data including land basic data and electronic component basic data used upon design of a circuit pattern of the circuit board; and using the stored CAD data as a production line unified criterion, and generating mounting data and inspecting data used to operate equipment and inspecting devices of a printing device, an electronic component mounting device, and a soldering device of the assembly line equipment on the basis of the CAD data.

14. The producing method as claimed in claim 8, further comprising:

storing CAD data including land basic data and electronic component basic data used upon design of a circuit pattern of the circuit board;

storing CAM data of operating conditions and inspecting conditions of the assembly line equipment; and generating, by making use of the stored CAD data as a production line unified criterion, mounting data and inspecting data used to operate equipment and inspecting devices of a printing device, an electronic component mounting device, and a soldering device of the assembly line equipment on the basis of the CAD data and the CAM data.

* * * * *